United States Patent
Lockhart et al.

(10) Patent No.: US 6,885,307 B2
(45) Date of Patent: Apr. 26, 2005

(54) BATTERY MONITOR

(75) Inventors: Bradley W. Lockhart, Fife Lake, MI (US); Jason W. Toomey, Traverse City, MI (US); Richard Campbell, II, Fife Lake, MI (US); Bruce R. Burry, Elk Rapids, MI (US); Bradley D. Looy, White Cloud, MI (US)

(73) Assignee: Tarma, LLC, Fife Lake, MI (US)

( * ) Notice: Subject to any disclaimer, the term of this patent is extended or adjusted under 35 U.S.C. 154(b) by 123 days.

(21) Appl. No.: 10/465,755

(22) Filed: Jun. 19, 2003

(65) Prior Publication Data

US 2004/0178918 A1 Sep. 16, 2004

Related U.S. Application Data

(60) Provisional application No. 60/390,016, filed on Jun. 19, 2002.

(51) Int. Cl.[7] ............................................. G08B 21/00
(52) U.S. Cl. .............................. 340/636.15; 340/636.1; 340/636.19; 324/433
(58) Field of Search .................. 340/636.15, 636.1, 340/636.19; 324/433, 426, 430, 435, 429, 434; 320/48, 116, 132, 149

(56) References Cited

U.S. PATENT DOCUMENTS

| 4,433,294 | A | * | 2/1984 | Windebank | 324/426 |
| 4,697,134 | A | | 9/1987 | Burkum et al. | |
| 5,099,211 | A | * | 3/1992 | Nowak | 324/434 |
| 5,572,136 | A | | 11/1996 | Champlin | |
| 5,661,463 | A | | 8/1997 | Letchak et al. | |
| 5,710,503 | A | | 1/1998 | Sideris et al. | |
| 6,316,914 | B1 | | 11/2001 | Bertness | |
| 6,332,113 | B1 | * | 12/2001 | Bertness | 702/63 |
| 6,404,166 | B1 | * | 6/2002 | Puchianu | 320/116 |
| 6,437,574 | B1 | * | 8/2002 | Robinson et al. | 324/426 |
| 2002/0075003 | A1 | * | 6/2002 | Fridman et al. | 324/426 |

OTHER PUBLICATIONS

GBN Technologies, *Intelligent Monitoring System*, Publication No. GB–3909, Jul. 2000.

* cited by examiner

Primary Examiner—Daniel Wu
Assistant Examiner—Sihong Huang

(57) ABSTRACT

An apparatus and method for monitoring at least one battery. A reference ramp voltage signal is applied to a battery. A difference between a measurement ramp voltage signal output from the battery and the reference signal is compared with a threshold to determine battery condition. The determined battery condition can be transmitted remotely from the battery location.

38 Claims, 25 Drawing Sheets

ALARM(MAJOR)　　　　　　　　　　　　　　　　　　　　　　　　<<back to map

| | | |
|---|---|---|
| Location: | Cabinet #: | Type: |
| Traverse City, MI | | |
| Park Dr. & Airport Rd | 1044 | Battery Vitality Failure |
| Device: | 12SLA25 VRLA Stand-By Battery | |
| Condition: | Battery Impedance Out of Range | |
| Battery #: | 3 | |
| String #: | 1 | |
| Type: | 12SLA25 | |
| Manufacturer: | Fiamm | |
| Date Stamp: | 9/28/2002 | | map/directions　　location history　　print work order　　notify technician　　override

Map Detail

ALARM(MAJOR)  <<back to map

| | | |
|---|---|---|
| Location: | Cabinet #: | Type: |
| Mt. Pleasant, MI | | |
| Bard Rd. & Beaverton Rd. | 3409 | Battery Overtemp |
| Device: | 12SLA25 VRLA Stand-By Battery | |
| Condition: | Battery Thermal Overload / Breakdown | |
| Battery #: | 2 | |
| String #: | 2 | |
| Type: | 12SLA25 | |
| Manufacturer: | Fiamm | |
| Date Stamp: | 10/10/2002 | | map/directions   location history   print work order   notify technician   override Map Detail ALARM(MAJOR)  <<back to map

| | | |
|---|---|---|
| Location: | Cabinet #: | Type: |
| Grand Rapids, MI | | |
| Bard Rd. & Beaverton Rd. | 2446 | String Voltage Low |
| Device: | Telecom Battery String | |
| Condition: | Voltage Below Set Threshold | |
| Battery #: | n/a | |
| String #: | 2 | |
| Type: | 12SLA25 String of (4) | |
| Manufacturer: | Fiamm | |
| Date Stamp: | 10/04/2002 | | map/directions    location history    print work order    notify technician    override Map Detail

BATTERY MONITOR

CROSS REFERENCE TO CO-PENDING APPLICATION

This application claims the benefit of the filing date of provisional patent application Ser. No. 60/390,016, filed Jun. 19, 2002, now abandoned, the entire contents of which are incorporated herein in its entirety.

BACKGROUND

The present invention relates, in general, to battery monitors and, more particularly, to apparatus for monitoring the status of a battery string under load.

Telephone systems are required by regulatory agencies to provide telephone service in the event of an electrical utility power outage for a predetermined period of time, such as eight hours, for example. Thus, while the telephone system is normally powered by the electric utility power, a backup battery system must be employed to provide the necessary emergency power.

The typical telephone system includes a large number of distributed telephone or cabinets or huts usually at widely spaced locations in metropolitan and rural areas. It is common to have a plurality of DC batteries connected in various serial and parallel arrangements or in so-called "strings". Such battery strings are charged by a trickle charger for the electric utility power. However, the battery strings provide the necessary backup power during an electric utility power outage which switched on via a suitable power outage detection and switching circuit.

As such, while the batteries may sit idle under a state of trickle charge for a considerable amount of time, it is important that each battery be operative in the event of a random power outage.

Monitoring the status of each of a plurality of batteries in each widely spaced telephone cabinets or huts is a time consuming and expensive task. One problem is simply the widespread nature of the telephone cabinet. Particularly in rural areas, such cabinets can be spaced many miles apart thereby making frequent and easy battery condition tests difficult.

The battery strings contain a number of batteries to provide a typical forty-eight volt supply. Depending on the telephone network, two volt, four volt, six volt and twelve volt batteries may be connected in series or series/parallel arrangements to provide the necessary forty-eight voltage DC backup power supply. Such batteries must be tested on a periodic basis and while being charged so as not to render the backup power supply inoperative during the battery test.

It would be desirable to provide a battery monitoring apparatus and method which overcomes the aforementioned problems in accurately and timely monitoring the condition of each battery in a backup power supply for a telephone communication network. It would also be desirable to provide a battery monitoring apparatus and method which is capable of automatically testing each battery in a battery string on a periodic or demand basis. It would also be desirable to provide a battery monitoring apparatus and method which not only is capable of testing the operative condition of each battery, but is also able to remotely communicate the test results to remote data collection sites. It would also be desirable to provide a battery monitoring apparatus and method in which the operative condition of the batteries are continually checked so as to generate an indication of a failing battery as soon as the battery operative condition falls below an operative threshold.

SUMMARY

The present invention is an apparatus and method for monitoring a battery, particularly batteries connected in a series connected string and supplying power to devices in remote locations.

In one aspect, the apparatus for monitoring a battery, includes control means for initiating a battery monitoring test, means, responsive to the control means, for generating a reference ramp voltage signal and a measurement ramp voltage signal, the measurement ramp voltage signal applied to the battery, and means for comparing a difference between a measurement ramp voltage signal output from the battery and the reference ramp voltage signal against a threshold to determine a battery condition or operative parameter.

In another aspect, the invention provides on-line monitoring of each of a plurality of batteries. The apparatus includes control means for initiating monitoring of one battery of the plurality of batteries, means, responsive to the control means, for generating a reference ramp voltage signal and a measurement ramp voltage signal, means for connecting the measurement voltage signal to the one battery under test, the control means comparing the measurement ramp voltage signal output from the battery with the reference ramp voltage signal against a threshold, for determining battery condition, and means for transmitting the battery condition to a remote site.

In another aspect, the invention is a method for monitoring a battery including the steps of initiating a battery monitoring test, generating a reference ramp voltage signal and a measurement ramp voltage signal, applying the measurement ramp voltage signal to the battery, and comparing the measurement ramp voltage signal output from the battery with the reference ramp voltage signal against a threshold to determine battery condition.

In another aspect, the method provides on-line monitoring of a plurality of batteries by applying the above step plus transmitting the battery condition to a remote site.

The battery monitor apparatus and method of the present invention affords many advantages over previously devised battery monitors, particularly monitoring apparatus for battery strings used to power electric equipment in widely spaced, remote locations. The apparatus and method make use of a unique DC ramp signal which provides an accurate determination of the battery condition and can be easily checked against a threshold preselected or dynamic. When a threshold is exceeded indicating an alarm condition, the alarm signal can be sent from the battery location to a remote data processor for storage, and/or alerting of service personnel.

BRIEF DESCRIPTION OF THE DRAWINGS

The various features, advantages and other uses of the present invention will become more apparent by referring to the following detailed description and drawing in which.

DETAILED DESCRIPTION

Figure 1:
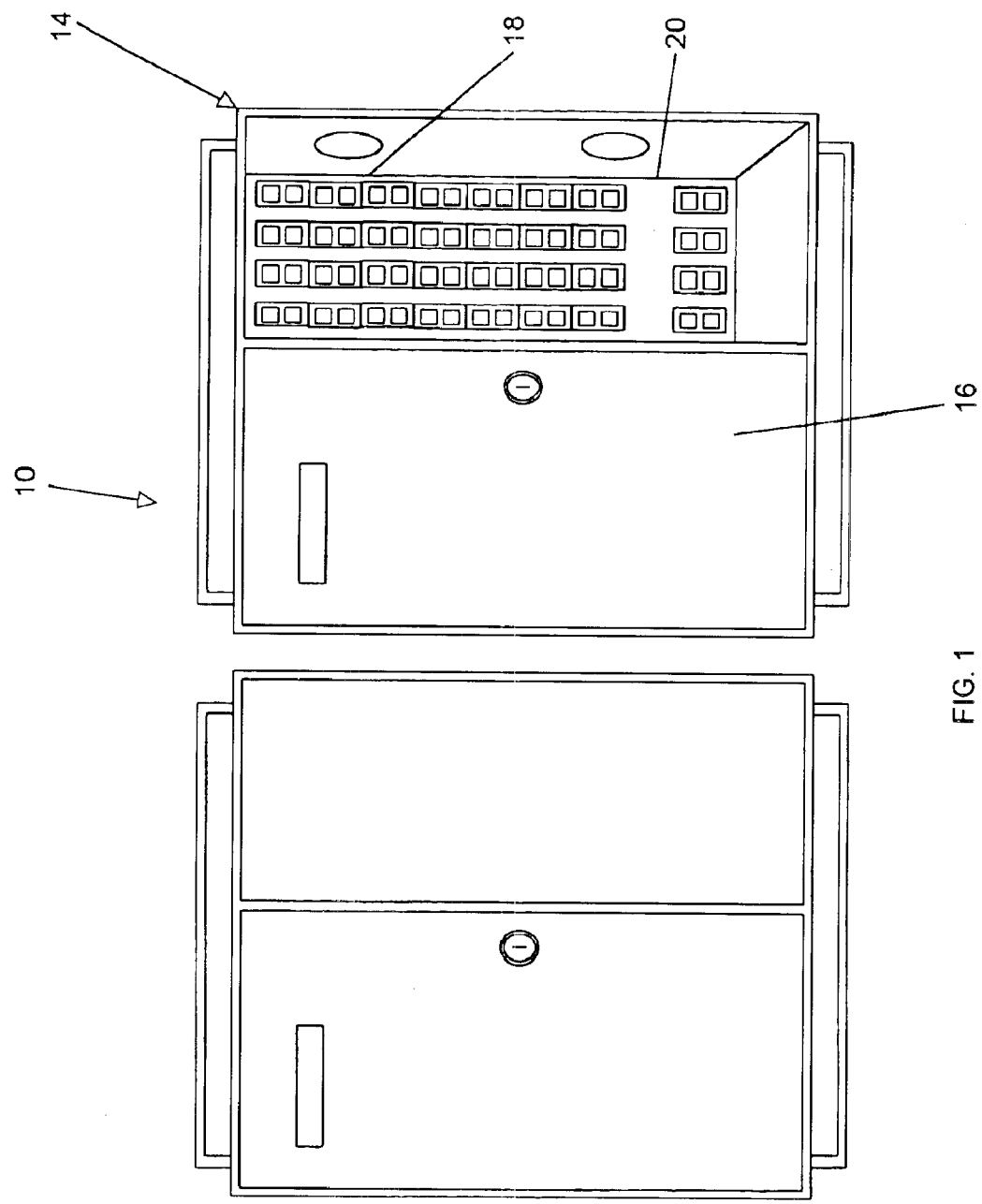
FIG. 1 is a front elevational view of a battery monitoring apparatus according to the present invention.

Referring now to FIGS. 1–8 of the drawing, there is depicted one aspect of a battery monitoring apparatus 10 which automatically monitors the operative status of each battery of a plurality of batteries arranged in a serially and/or serial/parallel connected string and generates and transmits an alarm signal indicating which battery in the string is below operative performance or condition.

As shown in FIG. 1, the apparatus 10 is includes a housing 14 which is mountable within a conventional telephone cabinet or hut, not shown. By way of example only, the housing 14 is provided with two lockable doors, with only one door 16 being shown. The lockable doors 16 may be provided with different keyed locks thereby providing distinct access to the interior of each section of the housing 14, if necessary.

As shown in FIG. 1, a plurality of terminals 18 and 20 are mounted in one section of the housing 14. The operative circuits, described hereafter, are mounted in the other closable section of the housing 14.

Figure 6:
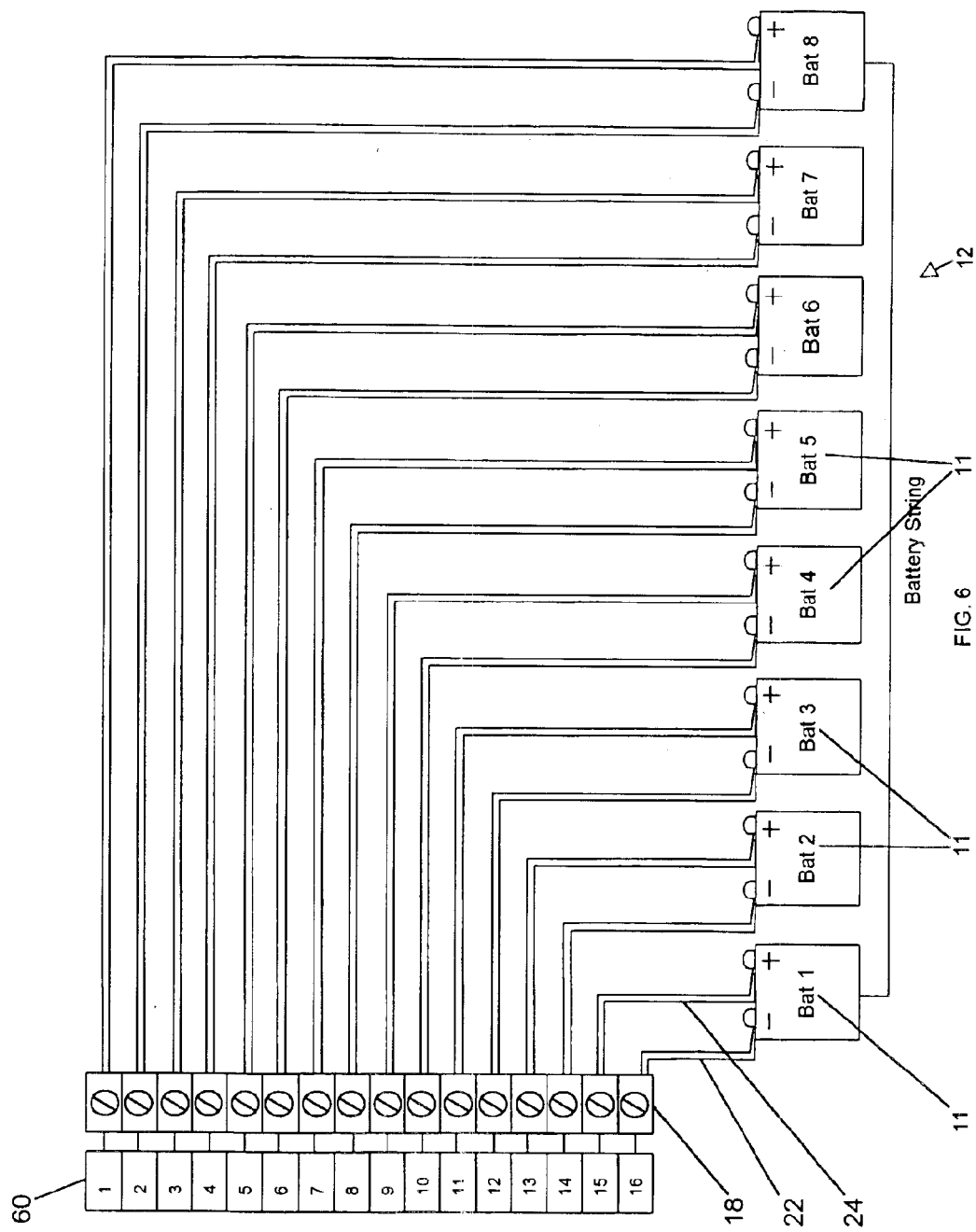
FIG. 6 is a circuit diagram of the battery string connections for the apparatus shown in FIG. 2.
Figure 7:
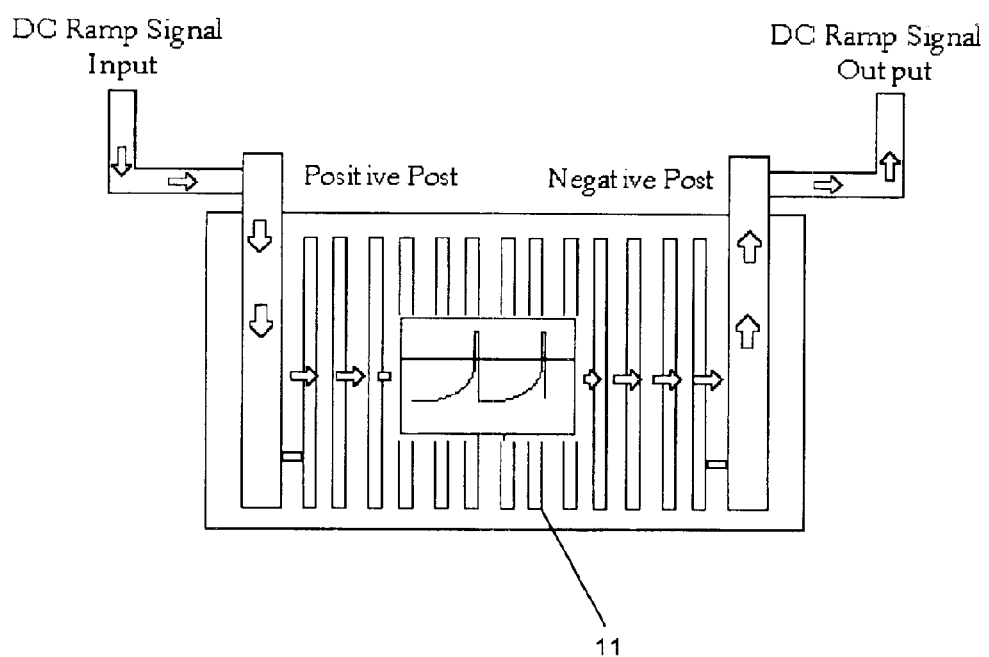
FIG. 7 is a pictorial representation showing the battery monitoring test according to the present invention.

The terminals 18 provide power connections to the apparatus 10 from the electric utility power terminals normally found in the overall telephone hut. The terminals 18 also provide connections to each battery 11 in the battery string 12. As shown in FIG. 6, two connections 22 and 24 extend from two terminals 18 to the positive and negative terminal on each battery 11. This provides independent selection of each battery 11 for a battery monitoring test as described hereafter. The connections 22 and 24 are in addition to the normal battery cables which interconnect the various batteries 11 together in the string 12 as well as to an external power input trickle charger and power output connections, not shown, to the other operative elements in the telephone cabinet.

The terminals 20 which are arranged in one strip, by example only, below the terminals 18 and provide connection to environmental sensors located in the overall telephone cabinet, such as an interior cabinet temperature sensor, a water level sensor, a smoke detector sensor and an intrusion sensor. These sensor outputs are provided as inputs to the battery monitoring apparatus 10 as described hereafter.

Figure 2:
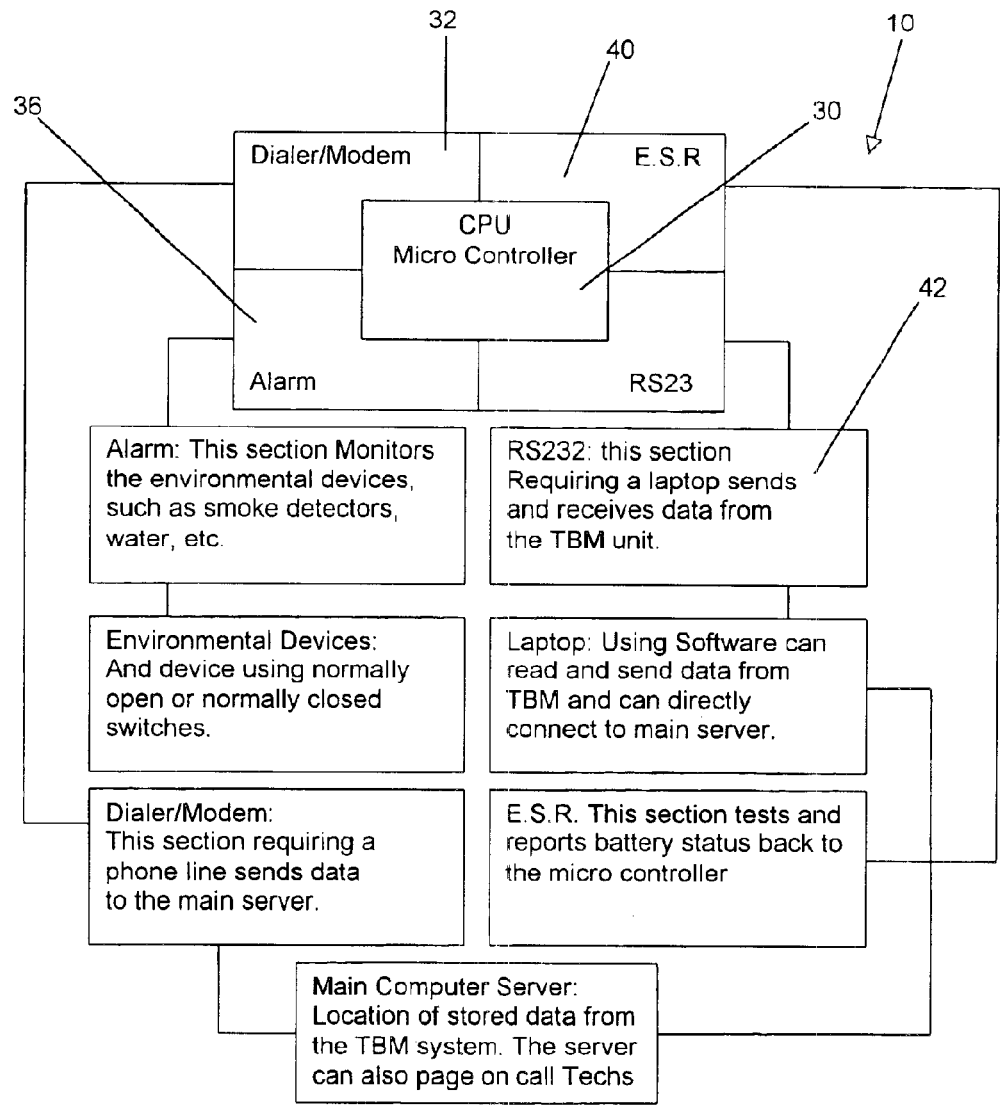
FIG. 2 is a general block diagram of one aspect of the battery monitoring apparatus according to the present invention.
Figure 3:
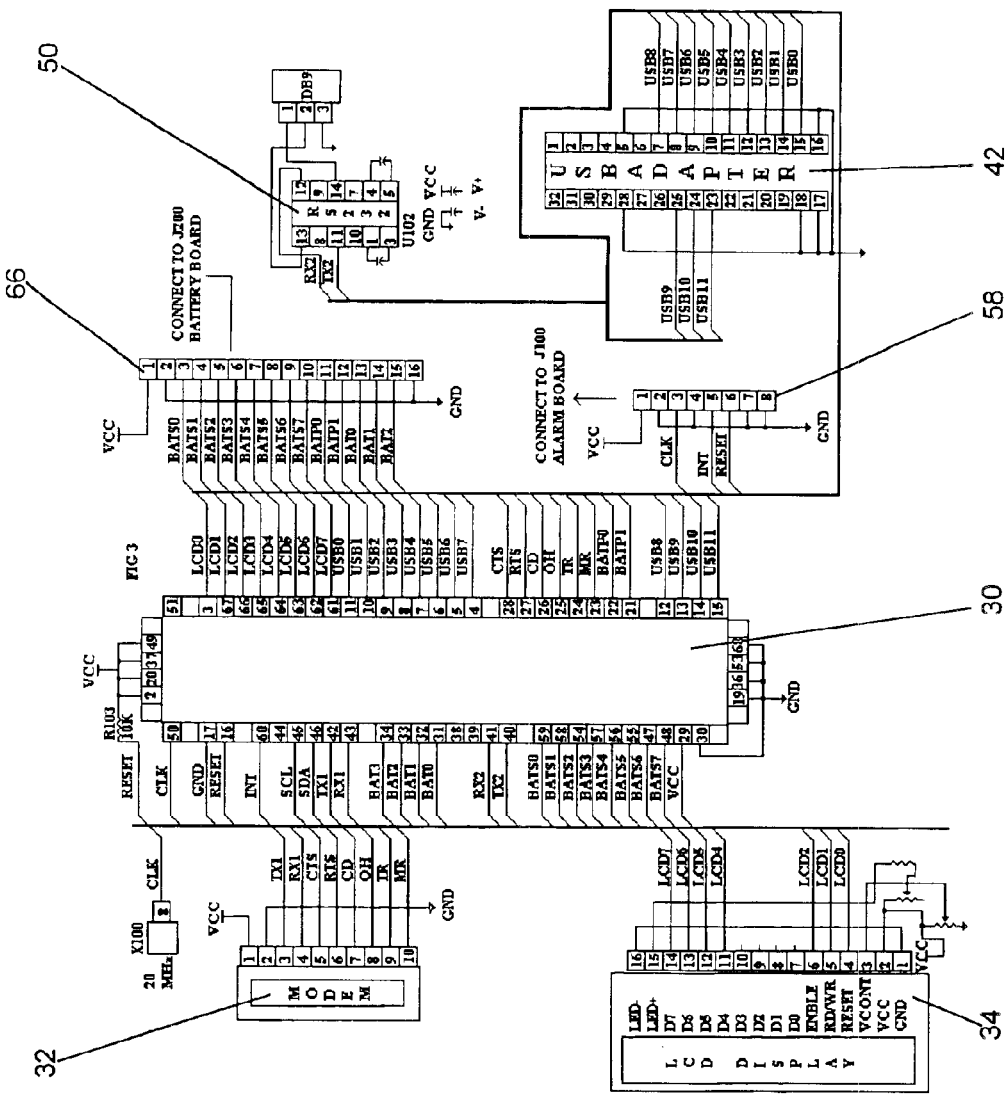
FIG. 3 is a circuit and block diagram of the battery monitoring apparatus as shown in FIG. 2.

As shown in FIGS. 2 and 3, the battery monitoring apparatus 10 of the present invention includes a number of interconnected components such as a central processing unit 30 which executes a control program stored in a memory, a remote telecommunications connection device 32, such as a dialer/modem, an optional display 34, such as an LCD display, an alarm circuit 36 which monitors the various environmental alarms in the telephone cabinet, such as smoke detectors, water level detectors, intrusion detectors, and cabinet temperature and which provides an output to the CPU 30 when one of the sensor outputs reaches an alarm threshold.

The apparatus 10 also includes a battery monitoring test circuit 40 which, according to the present invention, measures the electrical serial resistance of each battery 11 in the battery string 12.

A communication port, preferably an RS232 serial interface 42, is provided to enable the central processing unit 30 to be connected to a portable or laptop computer carried by the service person for programming of the CPU 30, responding to a battery failure signal from the CPU 30, etc.

The dialer modem 32 provides external signals via a telephone connection to a remote server to interconnect the CPU 30 with a global communication network, such as the Internet. This communication link allows the CPU 30 to report an inoperative battery 11 to a remote data collection site, such as the telephone company office.

As shown in FIGS. 3–6, the CPU 30 is preferably a micro-controller having onboard memory for storing the control program. By example only, the micro-controller is a PIC 16F877CPU.

The optional display 34 is, by example, a 16×2 Liquid Crystal Display (LCD). The display 34 is used to display data from the apparatus 10.

The CPU 30 is connected to the communications interface 42 which can be a serial RS232 interface or a USB data connection.

Also connected to the CPU 30 is the dialer/modem 32 which is used by the CPU 30 to send or receive data to a remote location, such as an Internet server. The CPU 30 controls the dialer when CPU 30 has data to send out, such as an alarm condition or a battery condition report. Once a connection is made by the dialer 32, to the communication network, the CPU 30 sends data through the dialer and the global communication network to the remote data collection site.

As shown in FIG. 3, a voltage regulator circuit 50 receives DC power and outputs regulated 5V power to the circuit elements of the apparatus 10. Alternately, electric power may be obtained from a 5V switching power supply.

The serial or USB interface 42 allows communication to a portable computer, such as a laptop computer, connected to the interface 42 by a service person. The interface 42 allows the portable or laptop to send or receive data from the CPU 30.

Figure 5:
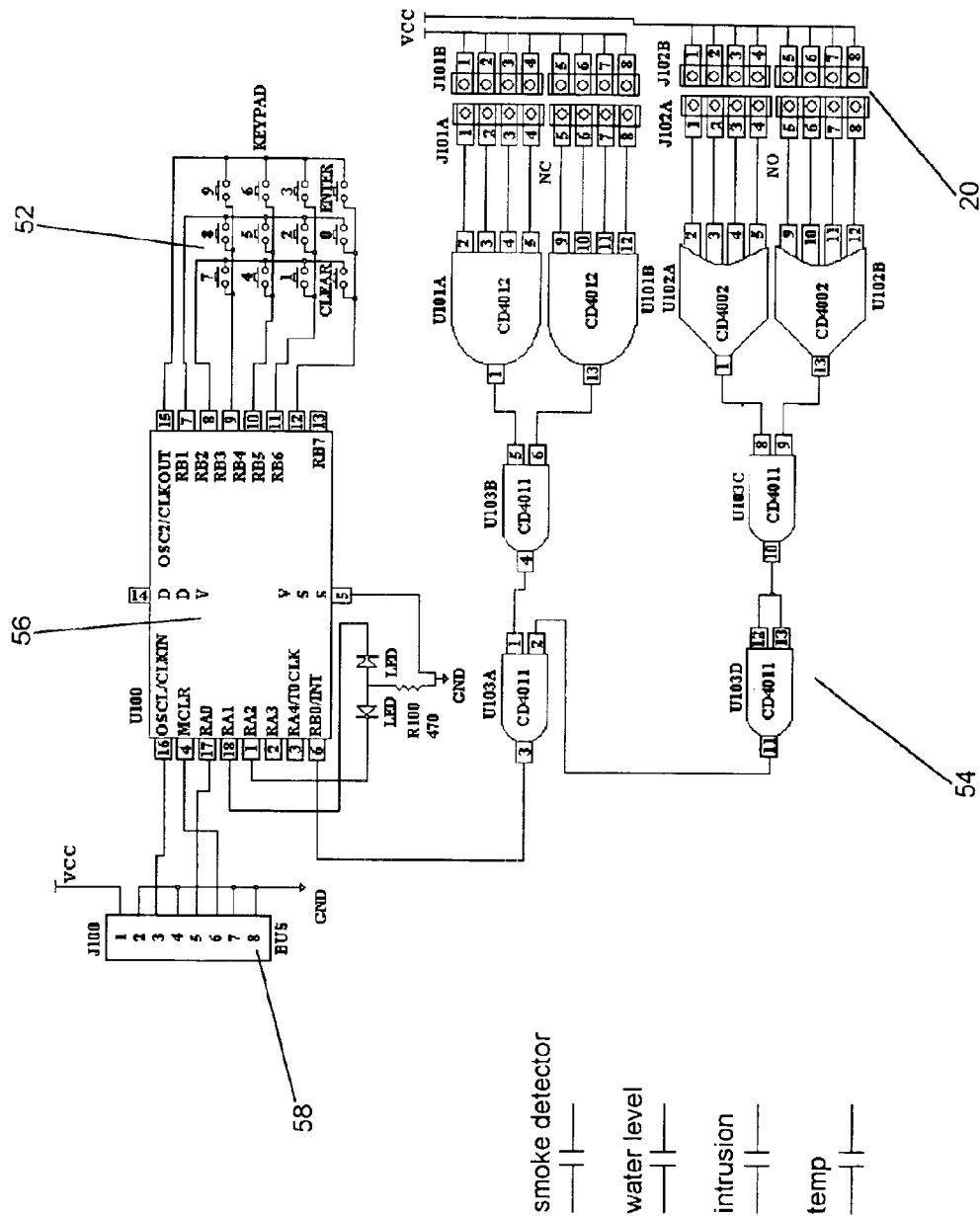
FIG. 5 is a circuit diagram of the alarm circuit shown in FIG. 2.

Referring briefly to FIG. 5, a keypad 52 mounted on the exterior of the telephone cabinet or hut allows a pass code to be entered to the CPU 30. The proper pass code allows a service technician to gain access to the interior of the telephone cabinet. After receiving a pass code, the CPU 30 checks for authorization and disables the intrusion alarm for the amount of time set by the end user. The CPU 30, upon receiving the proper authorization and pass code, also allows access to the CPU 30. The CPU 30 also sends data to the modem 32 for input in a remote database which contains the time, date of entry and pass code used to gain access to the telephone cabinet. Upon leaving the hut or cabinet, the service technician will reset the CPU 30 by entering the pass code followed by the star key.

The environmental sensor signals, which are typically electrical contact signals from the temperature, water level, intrusion and smoke detectors or sensors are connected across the terminals 20 shown in FIGS. 1 and 5. The terminals 20 are connected through a gate logic array 54 and combined to form an interrupt signal in a 16F84 circuit 56. The circuit 56 also receives the outputs from the keypad 52. The output of the circuit 56 is input by a connector 58 to the CPU 30 as shown in FIG. 3. In this manner, the existence of any alarm signal will generate an interrupt to the CPU 30 which will identify the particular alarm signal and transmit a signal through the modem 32 to the remote data collection site.

Figure 4:
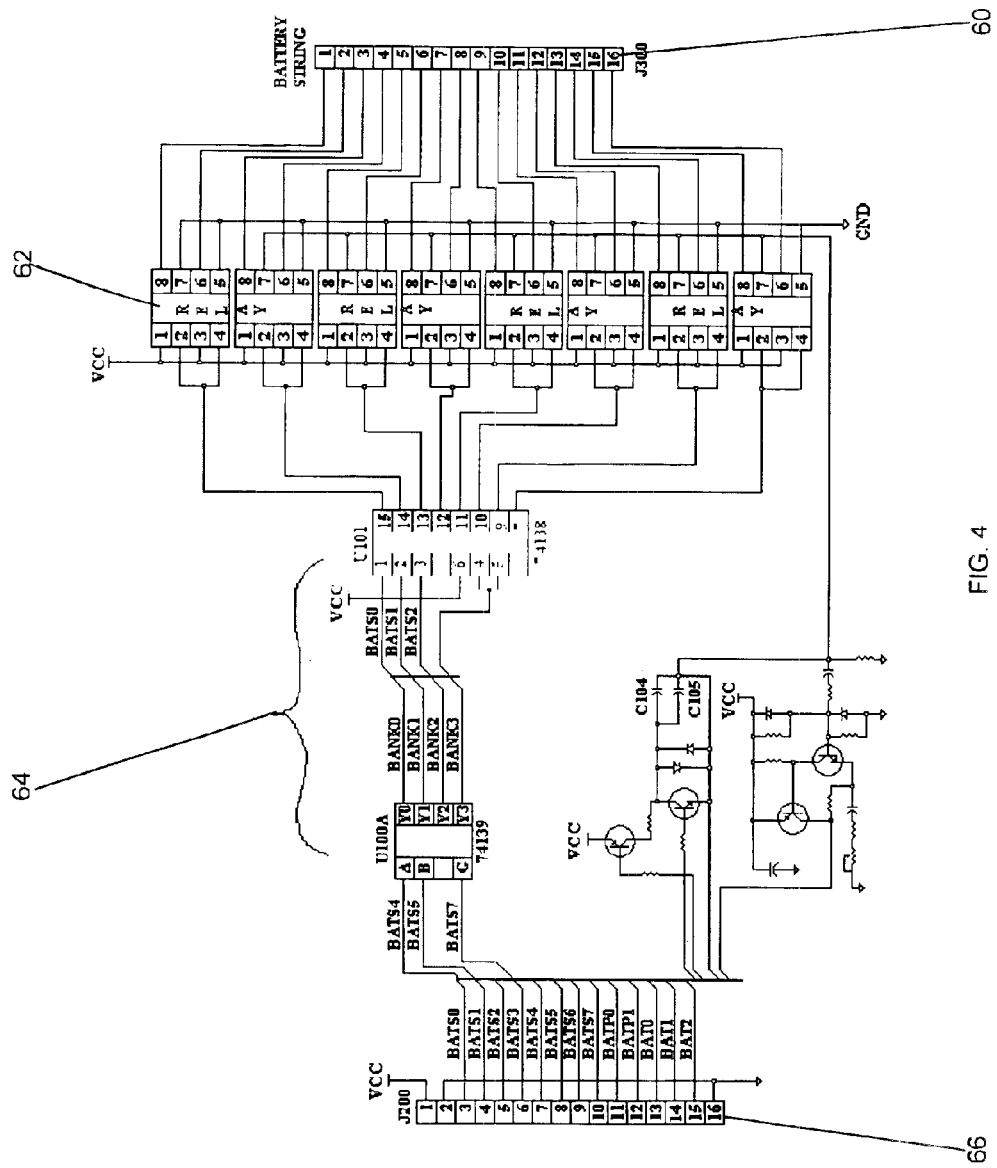
FIG. 4 is a circuit diagram of the battery select and DC ramp voltage generation circuit shown generally in FIG. 2.

The connections to the individual batteries 11 of the battery string 12 shown in FIG. 6 will now be described. As shown in FIG. 6, separate connections 22 and 24 to the positive and negative terminal of each battery 111 are made by a terminal strip 60. The terminal strip 60, shown in FIG. 4, is connected to controlled switches, such as optic reed relays 62 having switchable contacts, not shown. By way of example only, one relay 62 is provided for each battery 11 in the battery string 12. Each relay 62 includes two contacts to provide bi-directional signal flow for a battery input test signal and a battery output signal as described hereafter. Alternately, the relays 62 could be replaced by FET transistors.

The input and output connections to the relays 62 are provided through a multiplex circuit 64 which is responsive to input signals received through connector 62 from the CPU 30. In this manner, the CPU 30 can individually select each battery 11 of the battery string 12 for a monitoring test and receive the appropriate battery condition output.

Figure 8:
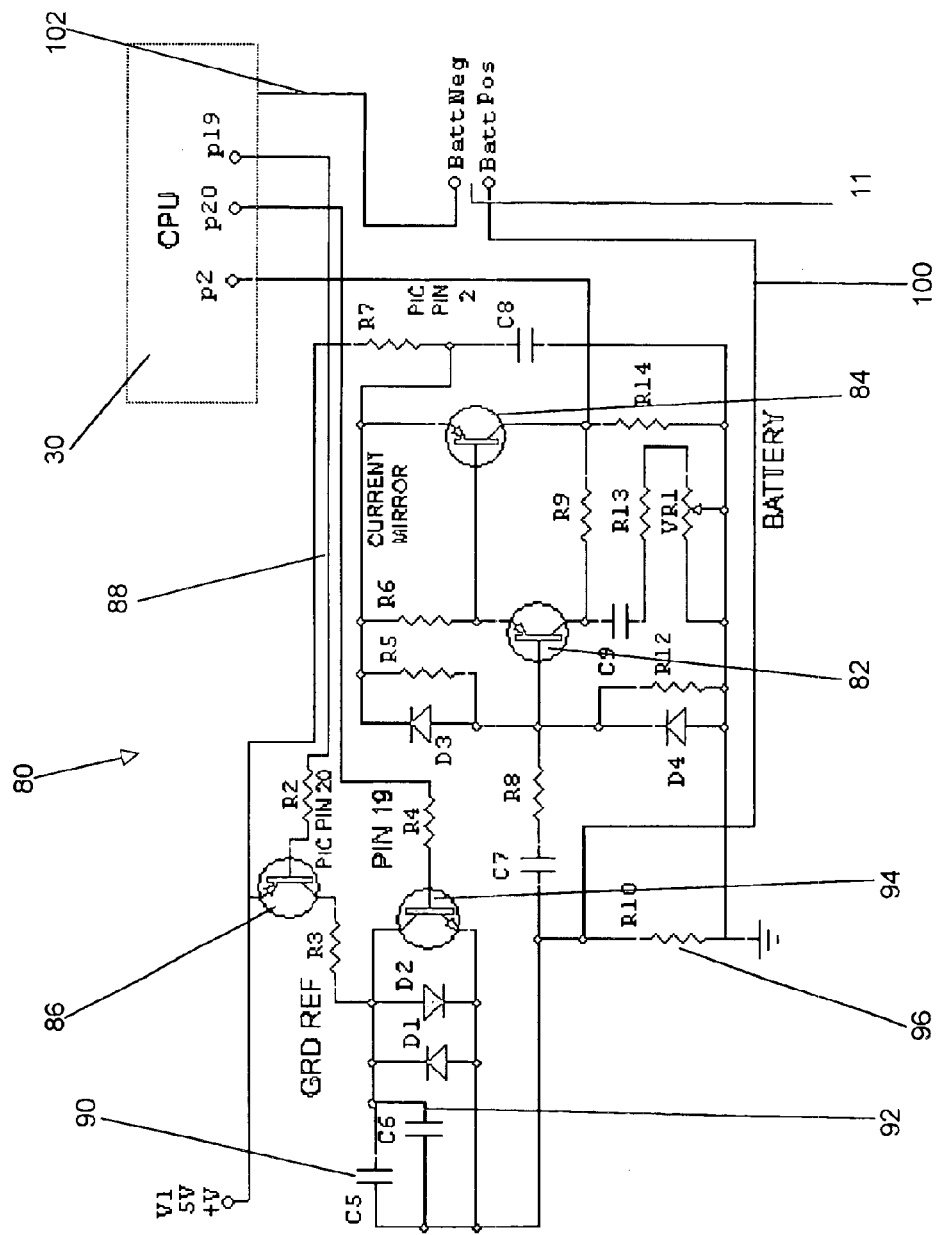
FIG. 8 is a circuit diagram of the DC ramp generator circuit utilized in the present apparatus.

A test signal generator is preferably in the form of a DC ramp generator 80 shown in FIG. 8. Two transistors 82 and 84 form a current mirror. Transistor 86 receives a pulse on line 88 from the CPU 30 to generate a reference pulse. This pulse is then fed into capacitors 90 and 92 and sent to the battery 11 under test.

The pulse is also sent to transistor 82. The transistor 84 receives the pulse from transistor 82, amplifies it and then sends it to the CPU 30. Transistor 94 is used as a ground reference through resistor 96. Transistor 94 is pulled high by the signal from the CPU 30 to calibrate the DC ramp generator 80 to zero Ohms. The reset to zero function of transistor 94 can be accomplished by firmware in the CPU 30 rather than by the transistor 94.

In this manner, the CPU 30 receives two signals: one, the pulse which is the reference ramp signal with respect to ground, and the other being the ramp output signal after passing through the battery 11 under test. This is shown more clearly in FIG. 7 where the DC ramp signal input from the capacitors 90 and 92 and identified by reference number 100 is input through the positive terminal or post of the battery 11 under test. This pulse is transmitted through the cells of the battery to the negative post wherein it is output on lead 102 to the CPU 30.

The CPU 30 then compares the ramp amplitude and, possibly, the ram signal length with the reference ramp amplitude and length to get the internal electrical series resistance of the battery 11 under test. The controller 30 can also sample battery voltage from the reference ramp signal level.

The electric serial resistance of the battery 11 can be used as a predictor of battery failure. The peak or maximum voltage of the reference ramp signal and the output ramp signal is compared by the CPU 30 to each other. A lookup table stored in memory is accessed by the CPU 30 to convert the ramp peak voltage to a resistance measurement, typically in milliohms. A threshold difference is preset or programmed into the CPU 30. The threshold difference is selected by a particular telephone company and can vary from 10% high to 20% low with respect to the reference peak voltage. The present battery monitoring apparatus and method, by using the DC ramp voltage as an input signal to create a reference signal and an output signal from the battery 11 under test, eliminates fluctuations in voltage measurements due to ambient temperature. As both the reference and output ramp signals will be equally affected, the battery monitoring test is immune to temperature effects. The threshold differences, either one or both of the high or low readings, can be varied.

The present apparatus 10 can be programmed to conduct a battery monitoring test on each battery 11 in a string 12 on a fairly quick periodic basis, such as once every hour of each twenty-four hour day. In this manner, an incipient battery failure can be promptly detected.

To eliminate false readings, the CPU 30 can set a flag when the threshold, such as either of the high or low thresholds are exceeded during one battery test. The CPU 30 can repeat the test at the preset periodic interval with a maximum number of flags equating to a battery failure which is reported by the CPU 30 to the remote data collection site. For example, three consecutive tests in which a battery ramp peak voltage is detected outside of one of the battery thresholds can be utilized by a telephone company as an indication of battery failure thereby prompting corrective action.

Referring now to FIGS. 9–12, there is depicted another aspect 110 of the present invention. In this aspect, the functions of the CPU 30 are replaced by a distributed network formed of a main controller 112 and a plurality of battery monitors or controllers 114, 116, 118, 120, etc., each of which is connected to a single battery 11, etc.

Figure 10:
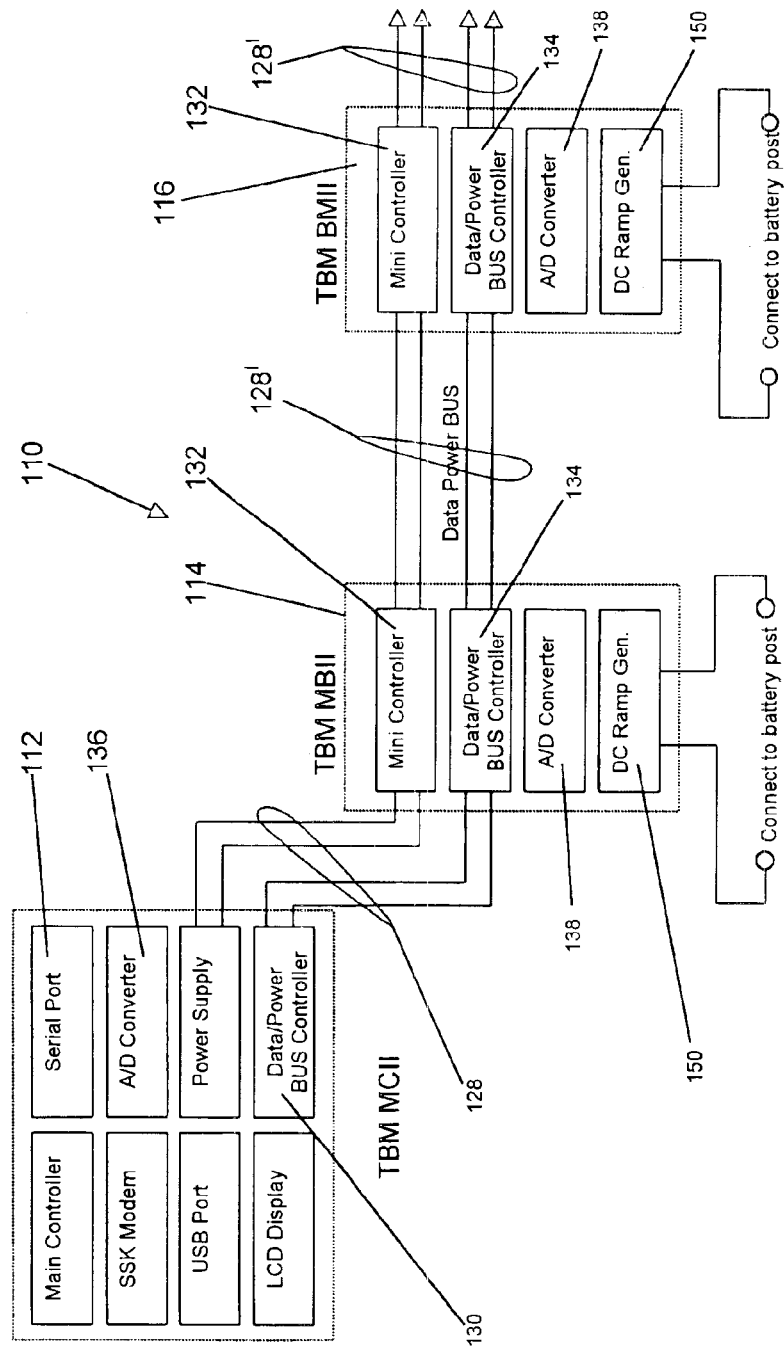
FIG. 10 is a detailed block diagram of the aspect of the invention shown in FIG. 9.

The main controller 112, shown in FIG. 10, includes essentially the same elements as the controller 30 described above. Thus, only the different or new features will be described for this aspect of the present invention.

A four wire cable 120 connects the main controller 112 to the first battery monitor 114.

Two of the wires in the cable, VCC+5 and ground extend between the power supply in a data/power bus controller 130 in the main controller 112 to the first battery monitor 114. As shown in FIG. 10, the power connections from the power supply in the main controller 112 are connected to a mini controller 132 in the battery monitor 114. The two cables of the data cable 128 extending from the data/power bus controller 130 to a similar data/power bus controller 134 in the first battery monitor 114 are transmit and receive lines, respectively.

A/D converters 136 and 138 are respectively provided in the main controller 112 and in each battery monitor 114, 116, etc., for any analog/digital conversion that may be required, such as the use of the keypad in the main controller 112 to set the resistance threshold values in the respective battery monitors 114, 116, etc.

A second data power bus 128' containing +5V and ground power lines and receive and transmit lines extends from the mini controller 132 and the data/power bus controller 134 in the first battery monitor 114 to a similar mini controller 132 and data/power bus controller 134 in the next serially connected battery monitor 116. A similar third data cable 128' connects similar circuits in the second battery monitor 116 to the third battery monitor 118 and so on through the plurality of battery monitors connected to a single controller 112. This arrangement connects the battery monitors 114, 116, etc., in a "daisy chain" arrangement.

Figure 11:
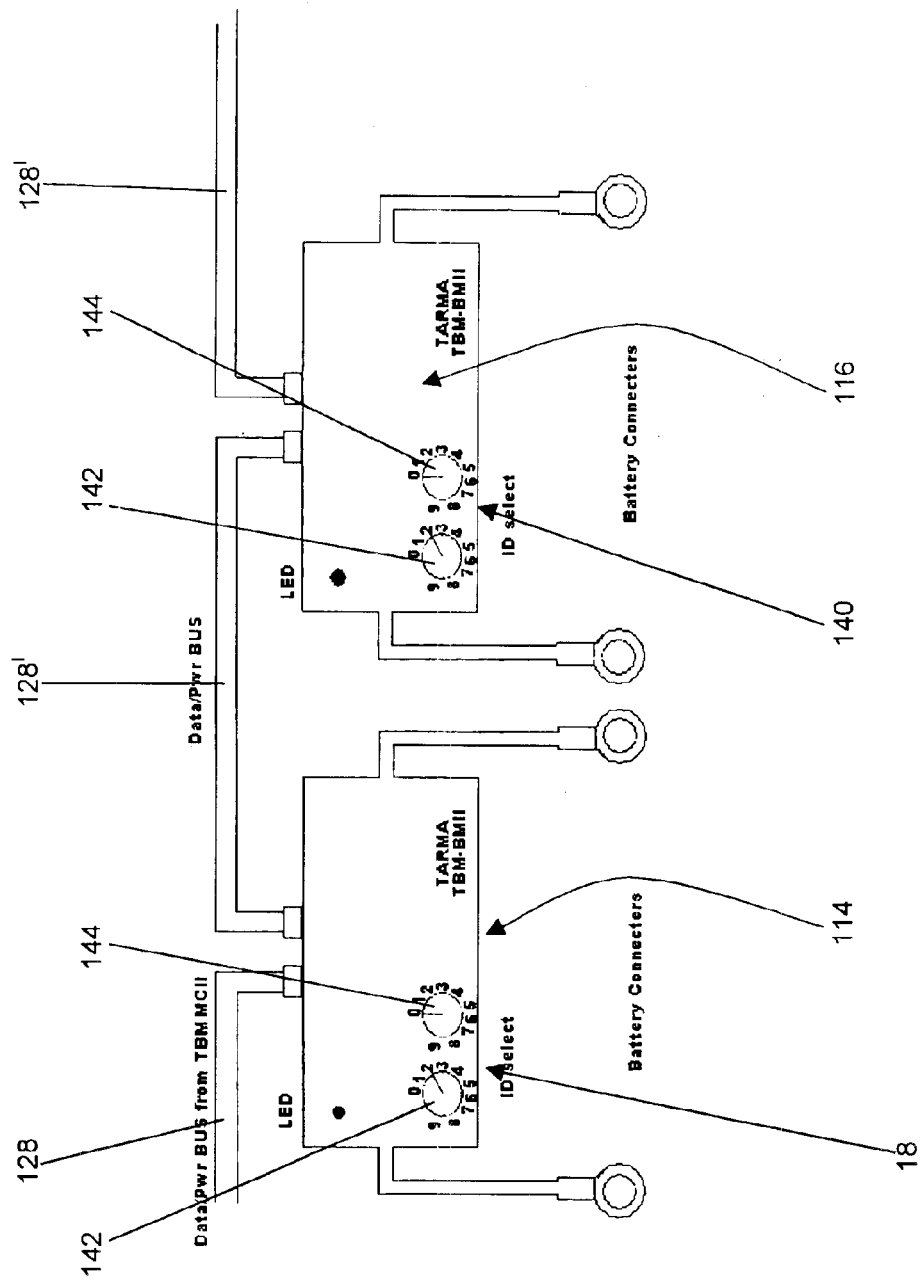
FIG. 11 is a pictorial representation of the battery controller and connections according to another aspect of the present invention.

As shown in FIG. 11, address or position select means 140 are provided on each battery monitor 114, 116, etc. The address or position select means 140 is, by way of example only, in the form of a pair of dial switches containing selectable positions, each providing an output representing addresses from zero to nine. Adjusting the two dials 142 and 144 in the input address select means 140 to zero one, respectively, sets the ID or address of the first battery monitor 114 to zero one. Turning the dials 142 and 144 of the address select means 140 in the second battery monitor to zero and two, respectively, will make the ID address of the second battery monitor 116 zero two.

Each battery monitor 114, 116, etc., includes a DC ramp generator 150 substantially the same as the DC ramp generator 80 described above and shown in the first aspect of the present invention.

Figure 12:
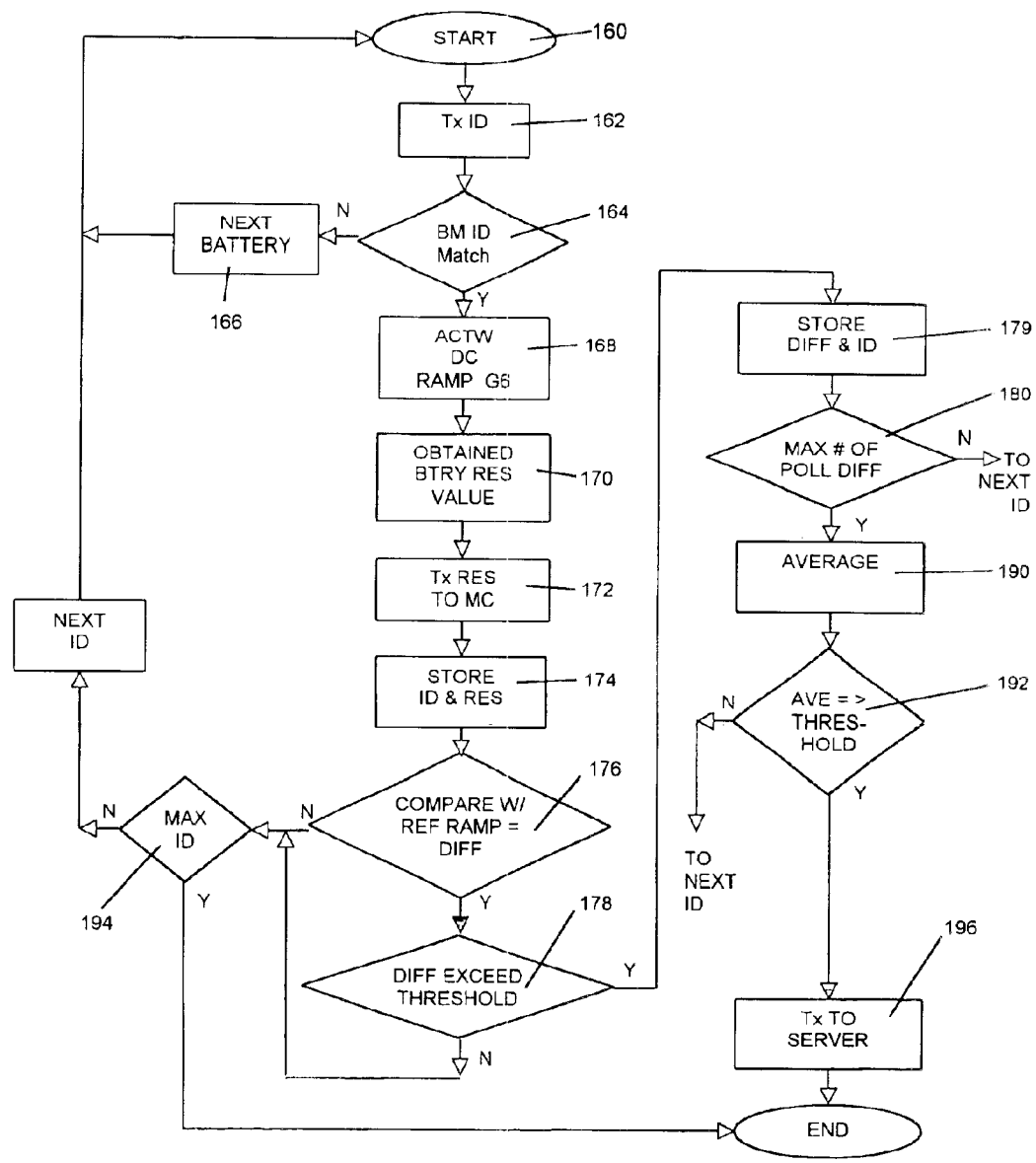
FIG. 12 is a flow diagram depicting the sequence of operation of another aspect of the present invention.

In operation, as shown in FIG. 12, step 160 starts the battery polling process. The main controller 112 will generate a battery monitor address and transmit the address or ID in step 162 to the first battery monitor 114. The battery monitor 114 will decode the address and determine whether or not the transmitted address matches its address or ID. If the transmitted ID comparison in step 164 does not yield a match, the ID from the main controller 112 is transmitted from the first battery monitor 114 in step 166 to the next battery monitor 116 and the process continued through the succeeding battery monitors 118, 120, etc., in the daisy chain until an ID match is made.

When the ID match is determined, the mini controller 132, in the first battery monitor, assumed to have an ID match, will activate the DC ramp generator 150 in step 168. The mini controller 132 reads the DC ramp output voltage in step 170 and then transmits the output battery serial resistance in step 172 over the data cable 128 to the main controller 112 by the receive or Rx line in the data cable 128.

In step 174, the main controller 112 stores the measured battery resistance and compares it to a threshold or threshold range set by the end user as depicted in step 176 and as described above.

A measured battery resistance out of the threshold range is a possible failure. The main controller 112 tags this event as a failure in step 178.

As described above in the first aspect of the present invention, the main controller 112 maintains the error reading during the next battery polling cycle in step 179. If the second reading for the same battery 11 is also out of the threshold range, the second reading is also tagged as a failure. If the third reading from the same battery monitor 114, etc., is out of the threshold range, step 180, the main controller 112 in step 190 takes all three battery resistance readings, forms an average in step 190, and then compares the average with the threshold range in step 192. If the threshold range is not exceeded, the main controller 112 checks to see if the maximum number of battery monitors have been checked in step 194 and, if not, returns to the beginning of the polling sequence and generates the next battery monitor ID in step 164.

However, if the average battery monitor readings for a particular battery 11 have been exceeded in step 192, the main controller 112 generates a battery failure signal and transmits the battery failure signal, along with a battery ID and the location of the battery enclosure 10 in step 196 to the server for transmission to the central office or facility for action.

Alternately, the main controller 112 can poll each battery 11 in one string or many strings, (four batteries in one string or eight batteries in two strings of four, for example) to obtain test results of each battery 11 in the same manner as described above. The main controller 112 can calculate a running average of all the battery tests in the string(s) as each battery test is completed and then compare the average with the individual data from one battery 11. Individual battery readings that are significantly different from the average could indicate a potentially bad battery.

The average battery reading for each battery in a string or strings at a particular location, or all of the batteries in many different locations can be averaged together to provide a baseline average which could be used for comparison with individual battery test results. The baseline average would be a dynamic average which can change as battery test results are continually added to the average poll. This baseline could also have a programmable threshold rather than a preset, hardware implemented threshold.

Refer now to FIGS. 13–19, there is depicted yet another aspect of a battery monitor apparatus 200 according to the present invention. The apparatus 200 shown generally in FIG. 13 functions in the same manner as the previously described battery monitor apparatus in that it is capable of monitoring of at least one and, preferably, a plurality of a series connected batteries or battery strings in one or more locations and transmitting the battery condition signals, as well as other environmental alarm signals to a remote server or processing unit for comparison, responsive action and data storage.

Figure 13:
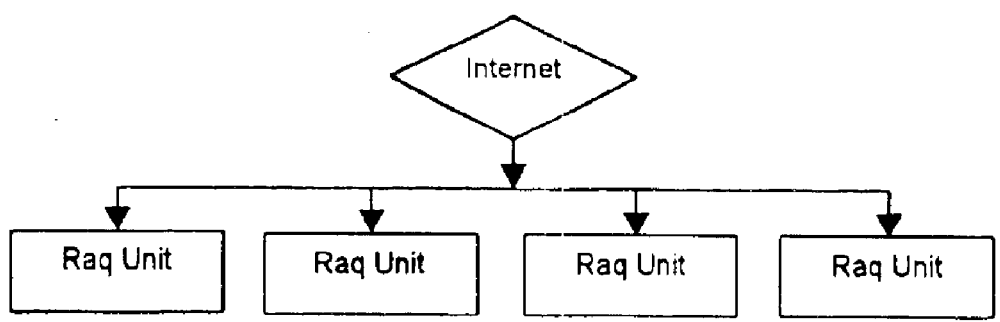
FIG. 13 is a pictorial representation of another implementation of the battery monitor apparatus of the present invention.
Figure 14:
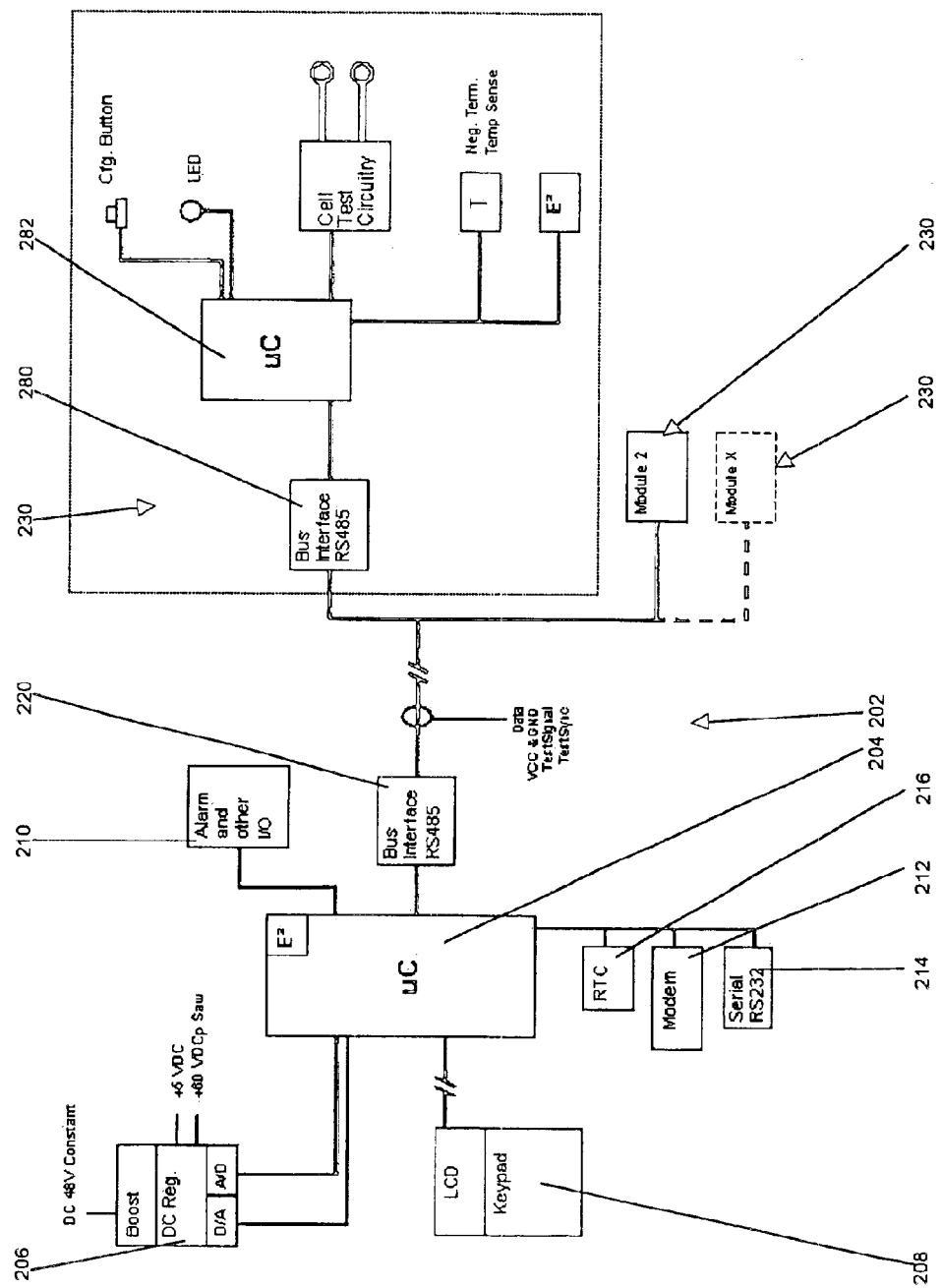
FIG. 14 is a block diagram of the major components of the host controller and the monitor module of the apparatus shown in FIG. 13.

As shown in FIGS. 13 and 14, the apparatus 200 includes a host controller 202 which includes a central processor 204 executing the control program stored in a memory. The processor 204 of the controller 202 receives power from a power supply 206 and inputs from a user input device, such as a keypad or portable computer 208, as well as inputs from environmental detectors, such as cabinet temperature, cabinet door open switch, etc., via sensors, all denoted by reference number 210. The processor 204 has output connections to a computer modem 212, a serial RS232 databus connector 214 and a real time clock (RTC) 216. The processor 204 is also connected through an RS485 bus interface 220 to at least one or more battery module controllers each denoted by reference number 230.

Primarily through the modem 212, the processor 204 is capable of connection through hardline, cable and/or wireless communication through the Internet 232 to a remote processor, such as a server 234, for reporting battery conditions, cabinet monitoring alarms, as well as to archive data on battery conditions at a particular battery location.

The actual circuits and connections for the host controller 202 are shown in FIGS. 15A, 15B, 16, 17 and 18.

Figure 15A:
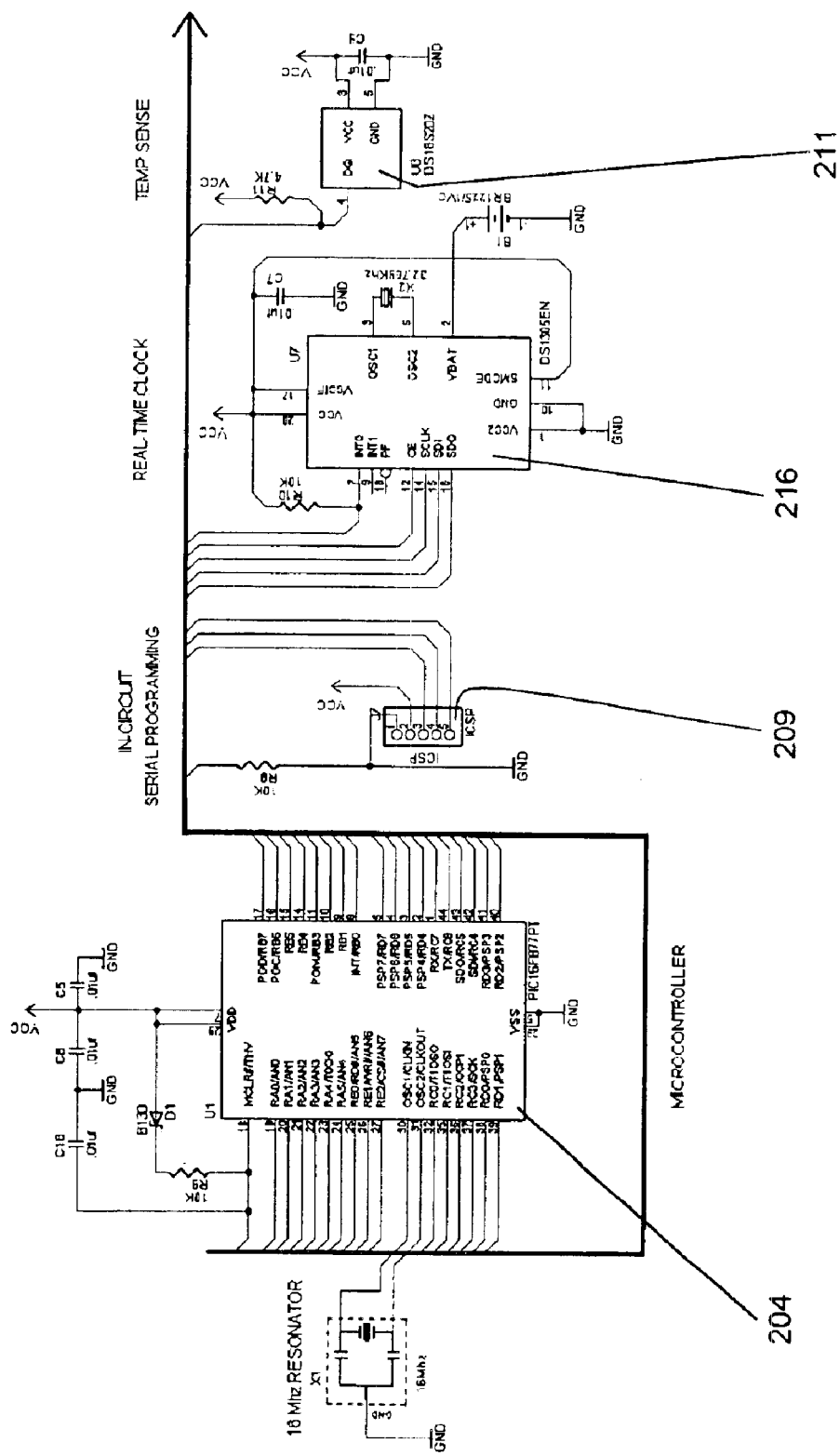
FIGS. 15A–18 are schematic diagrams of the host controller shown in FIG. 14.
Figure 15B:
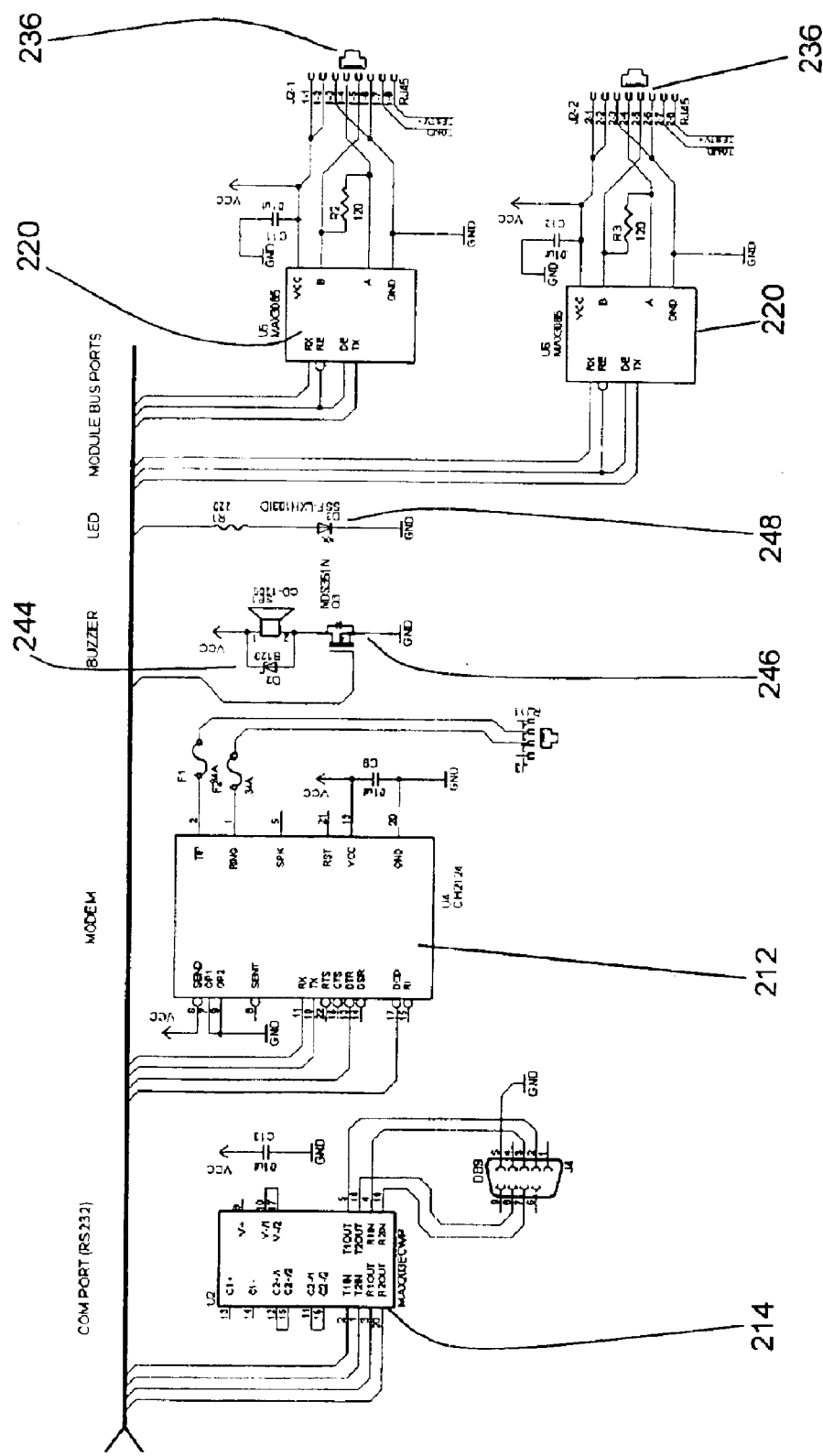

As shown in FIGS. 15A and 15B, suitable connections are provided between the central processor 204, which may be a micro-controller, MicroChip model number PIC 16F877, and the real time clock 216, the RS232 driver 214, the modem 212, a cabinet temperature sensor 211, a serial data programmer input 209, and, at least one and, preferably, a pair of RS485 line drivers 220, each connected to a separate RJ45 jack 236.

Figure 16:
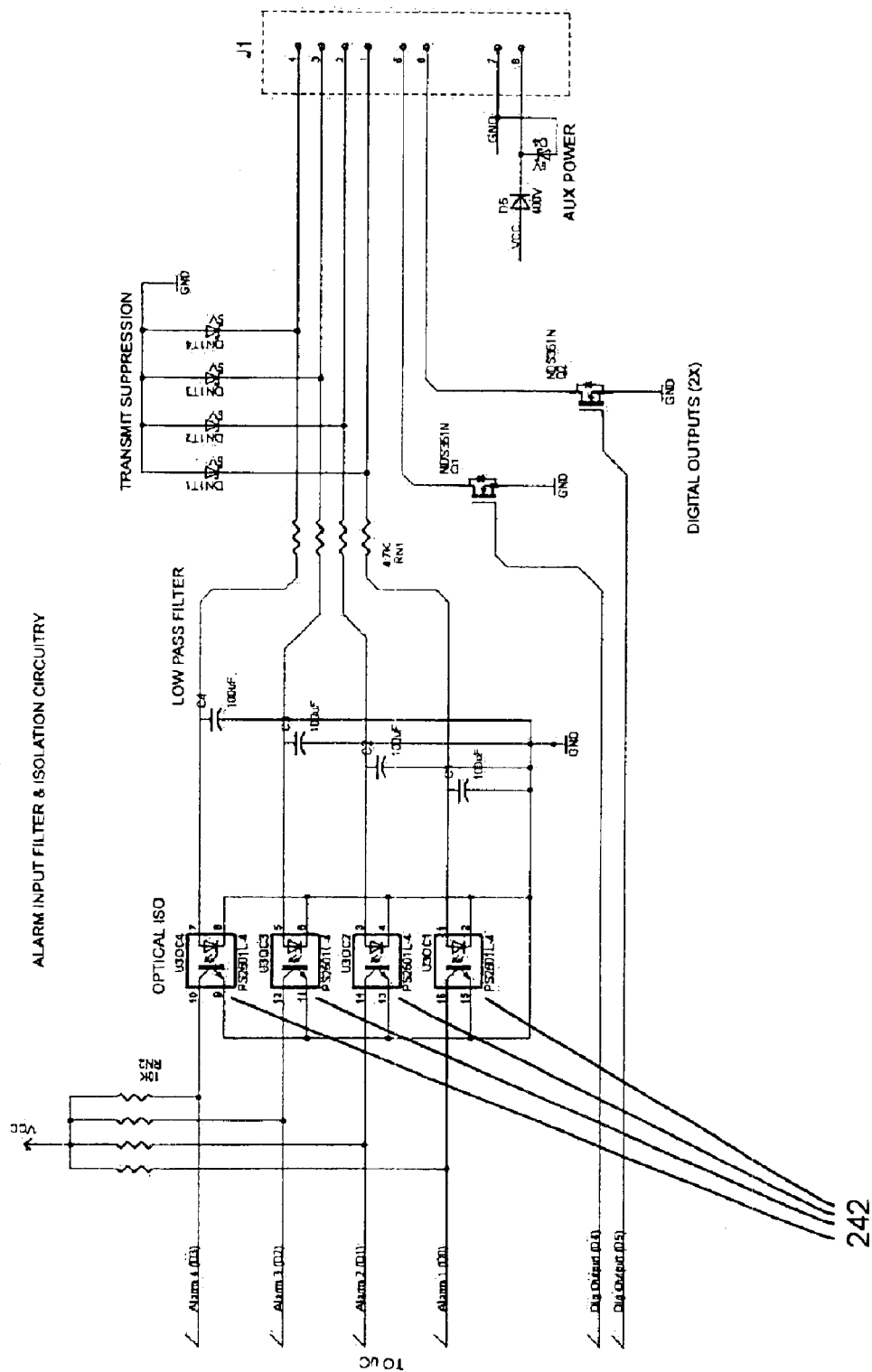

The inputs from the alarms and other I/O 210 are supplied through a terminal block 240 to a signal conditioning circuit formed of opto-couplers 242, the outputs of which are connected to inputs of the micro-controller 204 as shown in FIG. 16.

Also shown in FIG. 15B an onboard alarm 244, such as a piezobuzzer which is driven by a switch, such as a power MOSFET 246, is connected to an output of the processor 204.

An illuminatable light source, such as LED 248 is also connected as an output from the micro-controller 204. Both the alarm 244 and the LED 248 may be activated or energized by the microcontroller 204 in the event of an alarm condition, such as over temperature, unauthorized opening of the cabinet doors, etc.

Figure 17:
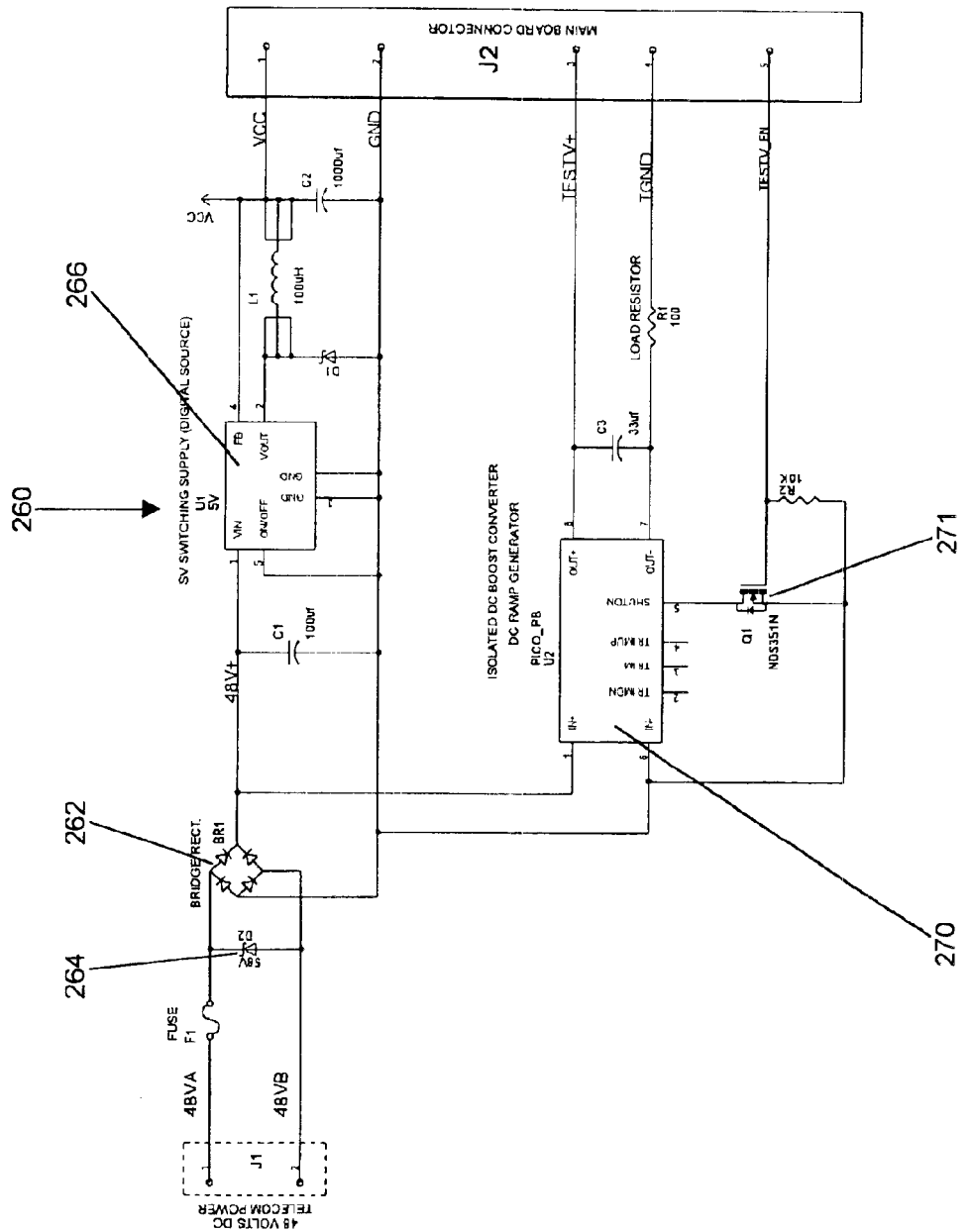
Figure 18:
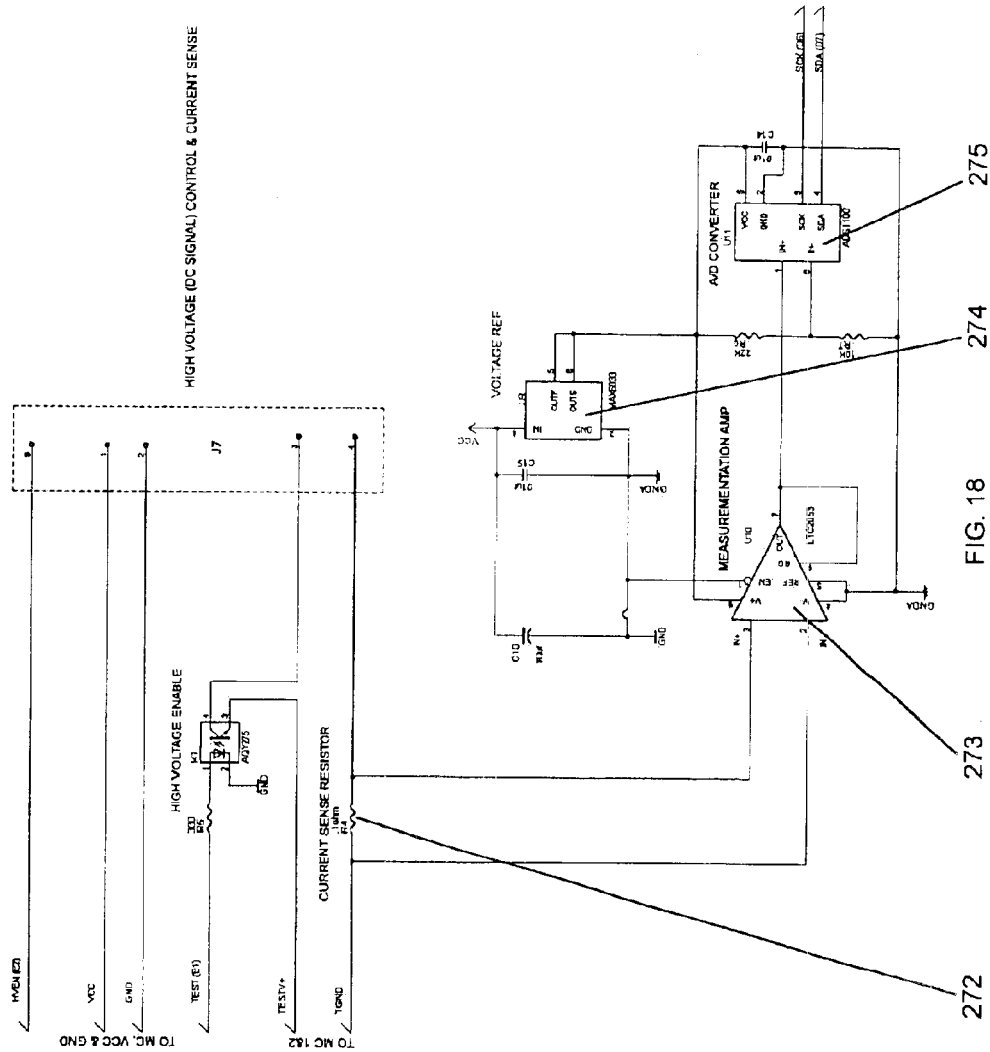

Referring now to FIG. 17, there is depicted the power supply 260 for the host controller 202. The power supply 260 receives a 48 volt input power which is supplied to a bridge rectifier 262. A transient voltage suppressor diode 264 is connected across the bridge rectifier 262.

The output of the bridge rectifier 262 are connected to a 5 volt switching supply 266, the output of which provides a regulated 5 volt signal on the VCC line to the remaining circuitry of the host controller 202.

The output of the bridge rectifier 262 is also connected to a dc boost converter and dc ramp generator 270 which provides output test and ground signals. The generator 270 can be a PICOP8IC chip.

Figure 19:
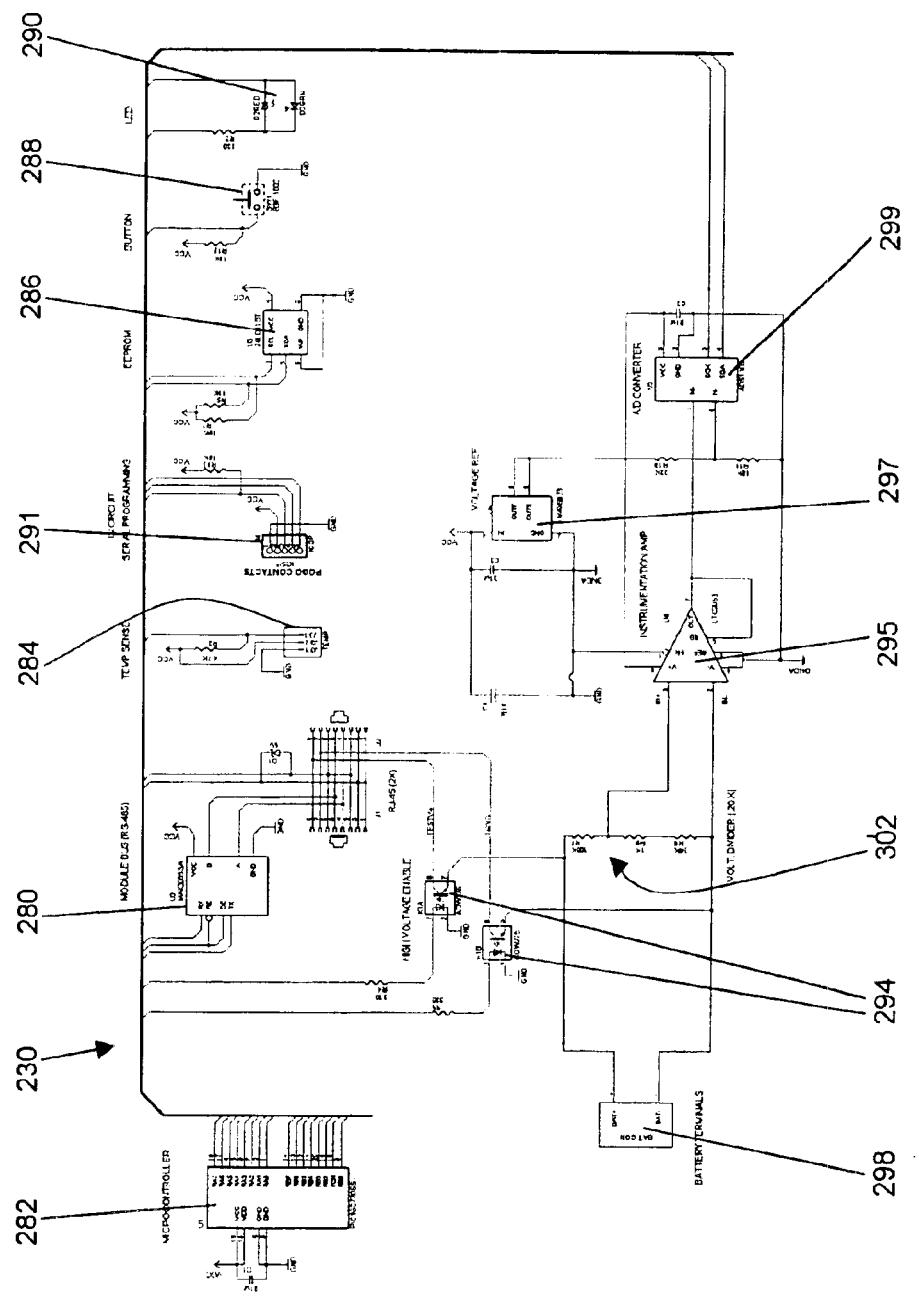
FIG. 19 is a block and schematic diagram of a battery cell test signal conditioning and measurement circuit according to the aspect of the invention shown in FIGS. 13 and 14.

Each battery monitor module 230, as shown in FIGS. 14 and 19, includes an RS 485 bus or driver interface 280 which handles bi-directional signals between the processor 204 and the host controller 202 and a similar processor or microcontroller 282 in the battery module 230. The microcontroller 282 may be a MicroChip PIC16C770 controller.

Also connected to the microcontroller 282 is a battery temperature sensor 284. A memory device 286, such as a EEPROM, is also connected, typically through a data bus, to the microcontroller 282. An on/off switch 288 and a user programmable interface 290 in the form of one or more photo-diodes 292, are also connected to the microcontroller 282.

A test enable signal from the controller 202 through the main board connector shown in FIG. 17 causes switch 271 to close and supplies and enables signal to the dc ramp generator 270. The dc ramp generator 270 then generates the dc ramp voltage signal on the TESTV+ line to each of the battery modules 230 in the battery string controlled by the controller 202.

Refer back to FIG. 18, the output from the selected battery module 230 is supplied across a current sense resistor 272 located as part of the host controller circuit, for example. The measured current is supplied to an instrumentation amplifier 273 controlled by a voltage reference signal generator 274. The output of the instrumentation amplifier 273 is converted to a dc value by an A/D convertor 275 which outputs digital signals representative of the measured battery current to the controller 202.

High voltage enable switch means 294, FIG. 19, in the form of a pair of solid state relays, by example only, are connected to outputs of the microcontroller 282, the battery monitoring circuit 300 and the RS485 line driver 280. The switch means 294 control the application of the dc ramp voltage signed from the host controller 202 to the battery cell under test.

Serial programming contacts 291 are also connected to the microcontroller 282 to provide serial programming of the microcontroller 282 via a portable lap top computer, hand-held programmer, etc.

As also shown in FIG. 19, the battery terminals 298 are connected to a voltage divider 302, the output of which is input to an instrumentation amplifier 295 which has a voltage reference signal from a voltage reference generator 297 applied thereto. The output of the instrumentation amplifier is input to A/D convertor 299 which outputs the measured battery voltage across the voltage divider 302 to the microcontroller 282 and from there to the host controller 202.

The operation of the battery monitor 230 is similar to that described above for the previously described and illustrated battery monitors of the present invention. In operation, a square wave pulse from the controller 202 is provided to begin DC ramp voltage flow to the one battery monitor 230 selected by the host controller 202. As the DC ramp signal is sent across the battery 298, the battery resistance is read back into the microcontroller 282 through the voltage divider 302. This value is transmitted by the microcontroller 282 of the server 234.

Figure 9:
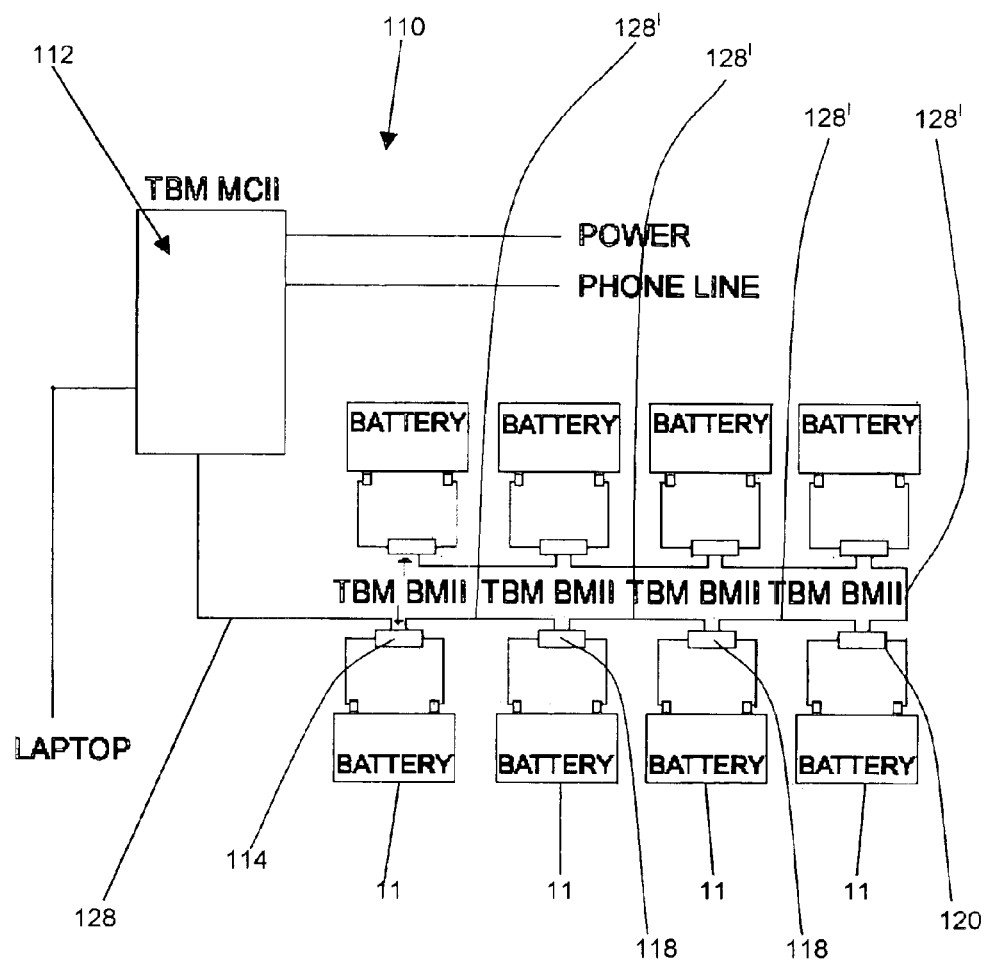
FIG. 9 is a general block diagram of another aspect of the present invention.

Each battery module 230 has a built in serial bus port to allow a plurality of like battery modules to be connected in a daisy-chain type connection as shown in FIGS. 9 and 13. Each battery module 230 has setable switches or inputs to provide an individual unit ID, as described above. This allows the host controller 202 to identify the battery condition data received by the host controller 202 for a particular battery.

The bus from the host controller 202 to the first battery monitor 230 and from the battery monitor to battery monitor in each string may be an eight-wire bus, such as an Ethernet-type RD-45 patch cable. The cable includes two +5 VCC signals which provide power to each battery monitor 230 to run the internal circuitry, two +5 VCC wires, two ground wires, two half duplex RS-485 data signal wires operating at 9600 band, and two high voltage test signal carriers (one plus and one minus or return). The host controller 202 polls the known IDs of each battery monitor 230 starting with ID 01 and continuing through all of the remainder of the battery monitors 230 connected in the battery string. As each battery monitor 230 receives request from the host controller 202, the DC ramp signal is supplied to the associated battery. The monitor 230 then sends the battery resistance reading data back through the host controller 202 to the server 234.

Each time the server 234 receives condition data from one battery monitor 230 or host controller 202, the data is stored and then compared to a threshold. If the data value is out of range of the set threshold, the data is tagged as a possible failure. The server 234 keeps track of this status and the indication of out-of-range threshold value as the polling cycle starts over. The second reading from the same battery monitor 230 is then received and compared to the last tagged or stored reading. If the reading is still out of the threshold range, the second reading is tagged. If the third reading from the same battery monitor 230 is still out of the threshold range, the server 234 averages all three readings. If the average is still out of the threshold range, the server 234 generates an indication of a failing battery.

Once each polling cycle of all the batteries in a particular string or strings in a location has been completed either once for each battery or multiple times as described above to obtain an average reading for each battery, the battery data is sent by the controller 202 to the server 234. In addition to the battery test data, the ambient cabinet temperature and individual battery temperature of each of the batteries, other alarm status and other data are also transmitted to the server 234. These additional data values enable the server 234 to determine an out of limit voltage or current to any particular battery, an out of range cabinet or battery temperature, etc.

The server 234 can also calculate a running average of all the batteries with which it communicates, thereby providing an average battery condition over large numbers of batteries as a comparison threshold. The battery data average is also a dynamic average, as new test data is continually added to the average.

Alternately, the out of threshold limit can be a programmable value rather than a preset, hardwired value entered by the end user. The user can simply program in a dynamic threshold against which the difference between each battery test data and the average battery test data is compared to determine in or out of threshold data.

The server 234 can also be programmed to determine the root-mean-square average or use a standard deviation analysis on the battery test data from all the batteries with which it communicates to provide a dynamic battery test data average which continually changes during the life of the batteries.

Referring back to FIG. 13, the data base manager or server 234 is formed of at least one or more processors which collect data from the remotely located controllers 202. An exemplary implementation, one server receives and scans the data for battery alarm conditions and the other server archives the data for later retrieval. The stored data is easily accessible and displayable via internet web pages enabling a customer to obtain a complete picture of current battery conditions or across an entire region in one glance.

Figure 20:
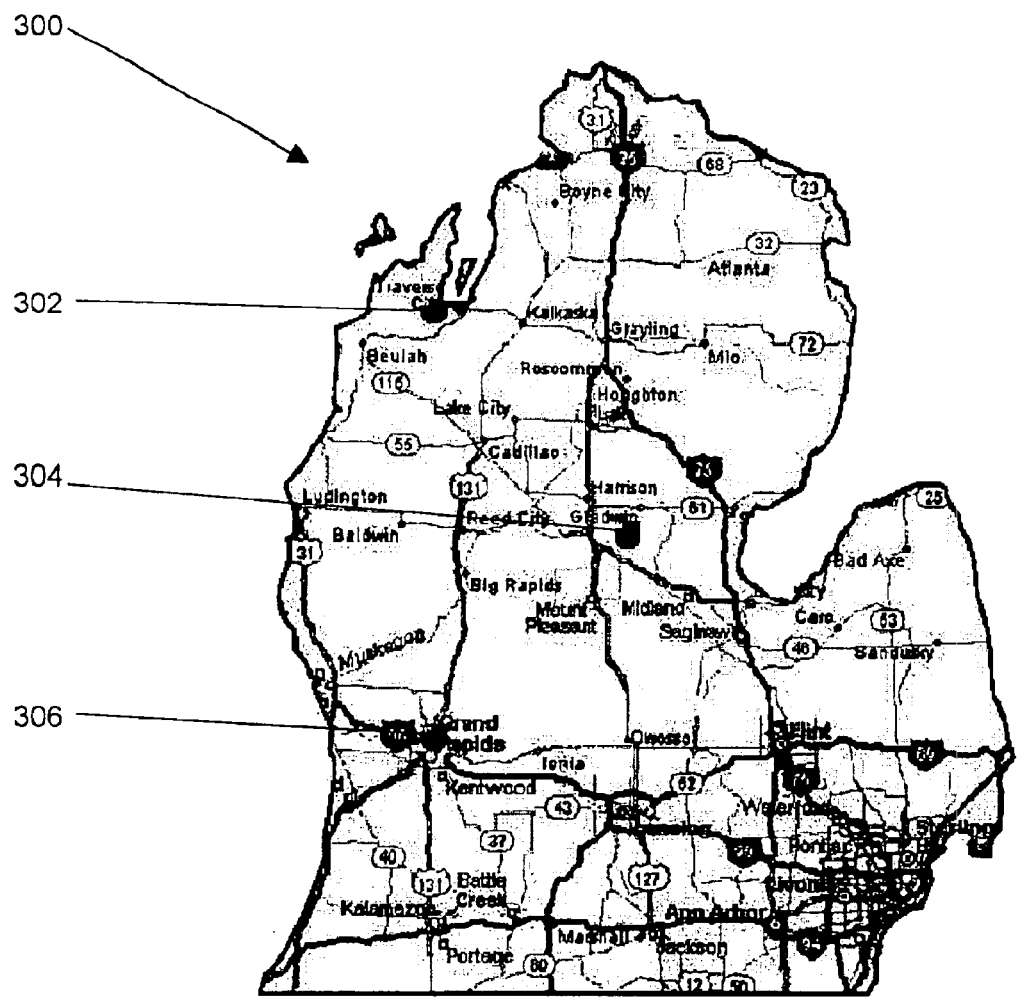
FIG. 20 is a screen display of a regional battery alarm alert according to the present invention.

For example, FIG. 20 depicts a screen display 300 for a user connected via a web interface to the server/database manager 234. The illustrated screen 300 is one of many alert methods which can additionally or alternately include e-mail, paging, facsimile and/or voice messaging.

The red dots 302, 304 and 306 show alarms generated from remote host controllers 202 indicating that the status of one or more batteries at each indicated location is out of parameter. The red dots 302, 304 and 306 may flash on and off to draw attention to the alarm condition.

Figure 21:
FIGS. 21, 22 and 23 are detailed screen displays of each alarm alert depicted in FIG. 20.
Figure 21:
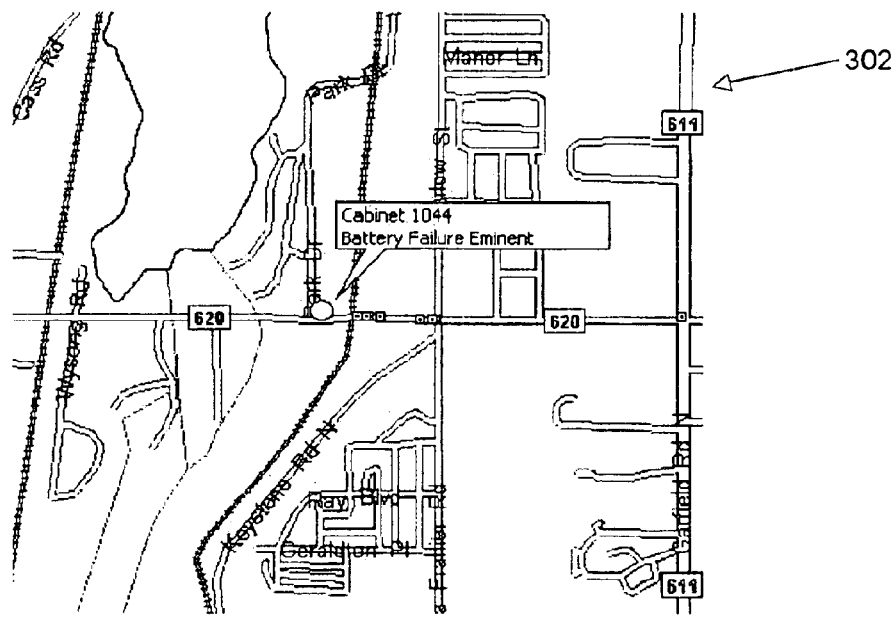

Clicking on each of the dots, such as dot 302 brings up the details of the alarm condition as shown in FIG. 21. The screen display shown in FIG. 21 includes information concerning the location of the specific battery equipment, including its street address, as well as battery specifications and indication of the alarm condition. Various actions are selectable including the displayed map as shown in FIG. 21 and directions to the battery location, a location history of the equipment and prior alarm conditions, printing up a work order, and for the notification of a technician for immediate service.

For example, alarm condition, noted by dot 302 in FIG. 21, indicates that one of the batteries at the specified location has an impedance out of a specified range.

Figure 22:
Figure 22:
Figure 22:
Figure 22:
Figure 22:
Figure 22:
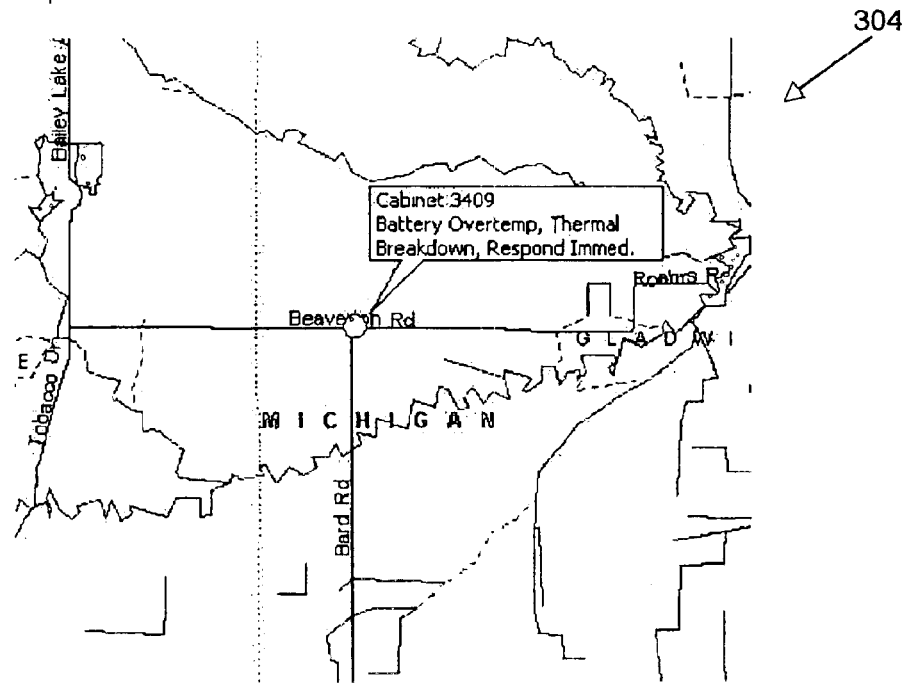

Clicking on the dot 304 brings up the screen shown in FIG. 22. Similar information is displayed. By example, the alarm condition shown in FIG. 22 is a battery thermal overload or breakdown.

Finally, clicking on the dot 306 brings up a similar screen for a different battery location. In this example, the battery alarm condition is a battery voltage below a set threshold voltage.

Figure 23:
Figure 23:
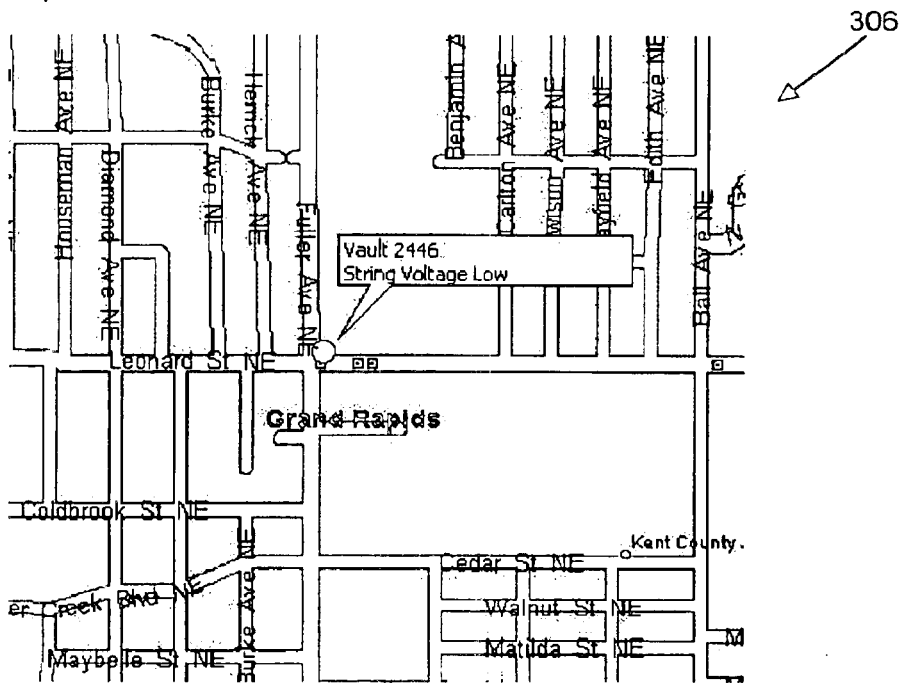
Figure 24:
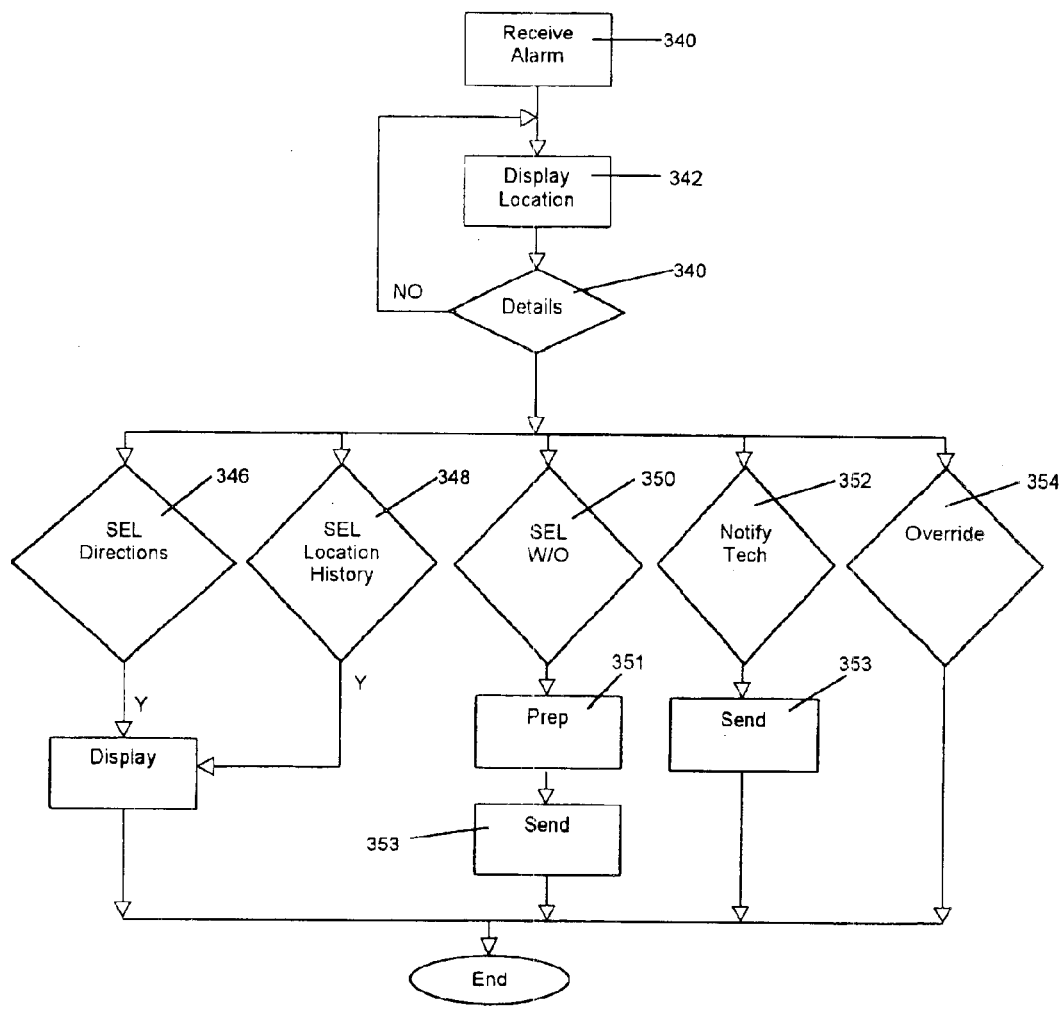
FIG. 24 is a block sequence diagram showing the operation of the central processor/server.

Instead of web pages alerts, as shown in FIGS. 21–23, the occurrence of any alarm condition as sent to the data base manager 234 can cause an immediate telephone call, facsimile, e-mail or voice message to a technician, with verbal instructions relating to the information shown in FIGS. 21–23 to enable the technician to facilitate a response and repair of the alarm condition.

When the database server 234 receives an alarm signal in step 340 from one of the post controllers 202, the server 234 generates a battery alarm alert as shown in one of FIGS. 21–23 and displays in step 234 on a suitable monitor battery parameters including battery type, battery location, manufacturer, battery application, number of battery in battery string, and the total number of battery strings at the same location. The display alarm alert also includes a statement of the battery condition alarm.

If the user which can be the customer or a monitoring company desire further detail, the user in step 344 clicks on one of the icons labeled map/directions, location history, print work order, notify technician, and override.

If map/directions icon is chosen in step 346, a detailed map, shown for convenience in FIGS. 21–23, is displayed along with road directions to the location of the battery. If location history is selected in step 348, an archived history of all of the prior battery alerts for the location in which the present battery alarm alert is associated with is displayed on the monitor.

If a print work order is desired, the print work order icon is selected in step 350 which generates a work order for service of the battery alarm alert. The work order is prepared in step 351 and sent in step 353 to the appropriate organization or person by any suitable transmission means, including Internet, e-mail, telephone, pager, etc. A technician or service person can be notified in step 352, by e-mail, pager, fax, telephone, to address the battery alarm alert.

The override icon can be selected in step 354 to delete the alarm alert.

What is claimed is:

1. An apparatus for monitoring a battery, the apparatus comprising:

control means for initiating a battery monitoring test;

means, responsive to the control means, for generating a reference ramp voltage signal and a measurement ramp voltage signal, the measurement ramp voltage signal applied to the battery; and means for comparing a difference between a measurement ramp voltage signal output from the battery and the reference ramp voltage signal for determining battery condition.

2. The apparatus of claim 1 wherein:

the reference ramp voltage signal and the measurement ramp voltage signal are DC ramp voltage signals.

3. The apparatus of claim 1 wherein:

the comparing means compares the reference ramp voltage signal and the measurement output ramp voltage signal in at least one of signal length and signal amplitude.

4. The apparatus of claim 1 further comprising:

communication means for transmitting the results of a battery monitoring test remote from the battery location.

5. The apparatus of claim 4 wherein the transmitting means comprises:

a communication modem coupled to the control means for establishing communication between the control means and a communication network.

6. The apparatus of claim 4 further comprising:

data communication means coupled to the control means for connecting a portable processing unit to the control means.

7. The apparatus of claim 6 wherein:
the data communication means is a serial interface.

8. The apparatus of claim 6 wherein:
the data communication means is a universal serial bus connector.

9. An apparatus for monitoring a plurality of batteries, the apparatus comprising:
control means for initiating monitoring of one battery of the plurality of batteries;
means, responsive to the control means, for generating a reference ramp voltage signal and a measurement ramp voltage signal;
means for connecting the measurement ramp voltage signal to the one battery under test; and
the control means comparing a measurement ramp voltage signal output from the battery with the reference ramp voltage signal for determining battery condition.

10. The apparatus of claim 9 wherein the connecting means comprises:
a multiplexer, responsive to the control means, for connecting the measurement reference voltage signal to the battery under test and the output reference signal from the battery to the control means.

11. The apparatus of claim 9 further comprising:
means, associated with each discrete one of the plurality of batteries for setting a discrete identification for each battery.

12. The apparatus of claim 9 wherein:
the plurality of batteries are connected in series.

13. The apparatus of claim 9 wherein the control means further comprises:
means for initiating monitoring of all of the plurality of batteries, one at a time, on a preset schedule.

14. The apparatus of claim 9 wherein:
the reference ramp voltage signal and the measurement ramp voltage signal are DC ramp voltage signals.

15. The apparatus of claim 9 wherein:
the comparing means compares the reference ramp voltage signal and the measurement output ramp voltage signal in at least one of signal length and signal amplitude.

16. The apparatus of claim 9 further comprising:
communication means for transmitting the results of a battery monitoring test remote from the battery location.

17. The apparatus of claim 16 wherein the transmitting means comprises:
a communication modem coupled to the control means for establishing communication between the control means and a communication network.

18. The apparatus of claim 16 further comprising:
data communication means coupled to the control means for connecting a portable processing unit to the control means.

19. The apparatus of claim 18 wherein:
the data communication means is a serial interface.

20. The apparatus of claim 18 wherein:
the data communication means is a universal serial bus connector.

21. A method for monitoring a battery comprising the steps of:
initiating a battery monitoring test;
generating a reference ramp voltage signal and a measurement ramp voltage signal, the measurement ramp voltage signal applied to the battery; and
comparing a measurement ramp voltage signal output from the battery with the reference ramp voltage signal against a threshold to determine battery condition.

22. The method of claim 21 wherein the step of generating the reference ramp voltage signal and the measurement ramp voltage signal further comprises the step of:
generating the reference ramp voltage signal and the measurement ramp voltage signal as DC ramp signals.

23. The method of claim 21 wherein the comparing step further comprises the step of:
comparing the reference ramp voltage signal and the measurement output ramp voltage signal in at least one of signal length and signal amplitude.

24. The method of claim 23 further comprising the step of:
transmitting the results of a battery monitor test remotely from the battery location.

25. The method of claim 24 wherein the transmitting further comprises:
coupling a communication modem to a means for initiating the battery monitoring test and a communication network.

26. A method for line monitoring a plurality of batteries, the method comprising:
initiating monitoring of one parameter of one battery of the plurality of connected batteries;
generating a reference ramp voltage signal and a measurement ramp voltage signal, and applying the measurement ramp voltage signal to the one battery; and
monitoring a measurement ramp voltage signal output from the battery with the reference ramp voltage signal and comparing a difference therebetween against a threshold to indicate battery condition.

27. The method of claim 26 wherein the initiating step and the comparing step are implemented by a central processing unit executing a stored control program.

28. The method of claim 26 further comprising the steps of:
providing main central processing unit executing a separate program for initiating the battery monitoring test;
providing a central processing unit executing a control program coupled to the battery in response to signals from the main central processing unit for generating the reference ramp voltage signal and the measurement ramp voltage signal; and
providing the comparing means in the main central processing unit.

29. The apparatus of claim 28 wherein the step of initiating a battery monitoring test comprises the step of:
providing a separate central processor coupled to each battery and responsive to distinct signals from the main central processing unit for initiating a battery monitoring test of only one battery.

30. The apparatus of claim 29 wherein:
generating a battery identification for initiating a battery monitoring test of one of the plurality of batteries.

31. The method of claim 26 further comprising:
on detecting a difference between the measurement ramp voltage signal output from one battery and the reference ramp voltage signal against the threshold, repeating the battery monitoring test on the one battery at least one more time;
if each battery monitoring test on the one battery generates a difference exceeding the threshold, averaging the differences to generate an average difference and comparing the average difference against the threshold; and
if the average difference is outside of the threshold, generating a battery failure signal.

32. The method of claim 26 further comprising the steps of:
storing battery specification data including at least one of battery location, battery type, battery connection circuit, battery voltage and battery current;

receiving an alarm alert from one battery central processor; and displaying battery data associated with the alarm alert.

33. The method of claim 32 wherein the step of displaying battery data further comprises the step of:

displaying battery geographic location.

34. The method of claim 32 wherein the step of displaying battery data further comprises the step of:

displaying battery alarm alert data.

35. The method of claim 32 wherein the step of displaying battery data further comprises the step of:

displaying at least one of battery specifications and location.

36. The method of claim 32 further comprising the step of:

displaying geographic directions to the battery location.

37. The method of claim 32 further comprising the step of:

generating a work order for service of the battery.

38. The method of claim 32 further comprising the step of:

sending an alarm alert to repair personnel.

* * * * *